(12) United States Patent
Mullner et al.

(10) Patent No.: US 7,710,766 B2
(45) Date of Patent: May 4, 2010

(54) MULTI-STATE MEMORY AND MULTI-FUNCTIONAL DEVICES COMPRISING MAGNETOPLASTIC OR MAGNETOELASTIC MATERIALS

(75) Inventors: Peter Mullner, Boise, ID (US); William B. Knowlton, Boise, ID (US)

(73) Assignee: Boise State University, Boise, ID (US)

( * ) Notice: Subject to any disclaimer, the term of this patent is extended or adjusted under 35 U.S.C. 154(b) by 44 days.

(21) Appl. No.: 11/940,316

(22) Filed: Nov. 14, 2007

(65) Prior Publication Data

US 2008/0225575 A1 Sep. 18, 2008

Related U.S. Application Data

(60) Provisional application No. 60/859,163, filed on Nov. 14, 2006.

(51) Int. Cl.
*G11C 11/00* (2006.01)
(52) U.S. Cl. .................. 365/157; 365/145; 365/66; 365/225.5; 365/185.03
(58) Field of Classification Search ............. 365/157, 365/145, 66, 225.5, 185.03
See application file for complete search history.

(56) References Cited

U.S. PATENT DOCUMENTS

| | | | |
|---|---|---|---|
| 5,952,094 A * | 9/1999 | Van Kesteren et al. ... | 428/822.3 |
| 2004/0160846 A1* | 8/2004 | Rinerson et al. ....... | 365/230.06 |
| 2004/0264229 A1* | 12/2004 | Tsu ............................. | 365/113 |
| 2005/0050258 A1* | 3/2005 | Frommer et al. ............... | 711/2 |
| 2007/0267596 A1* | 11/2007 | Husmann et al. .............. | 252/67 |
| 2008/0180991 A1* | 7/2008 | Wang ......................... | 365/171 |
| 2008/0246104 A1* | 10/2008 | Ranjan et al. ............... | 257/421 |

* cited by examiner

*Primary Examiner*—Connie C Yoha
(74) *Attorney, Agent, or Firm*—Pedersen & Co., PLLC; Ken J. Pedersen; Barbara S. Pedersen

(57) ABSTRACT

Apparatus and methods are disclosed that enable writing data on, and reading data of, multi-state elements having greater than two states. The elements may be made of magnetoplastic and/or magnetoelastic materials, including, for example, magnetic shape-memory alloy or other materials that couple magnetic and crystallographic states. The writing process is preferably conducted through the application of a magnetic field and/or a mechanical action. The reading process is preferably conducted through atomic-force microscopy, magnetic-force microscopy, spin-polarized electrons, magneto-optical Kerr effect, optical interferometry or other methods, or other methods/effects. The multifunctionality (crystallographic, magnetic, and shape states each representing a functionality) of the multi-state elements allows for simultaneous operations including read&write, sense&indicate, and sense&control. Embodiments of the invention may be used, for example, for storing, modifying, and accessing data for device, sensor, actuator, logic and memory applications. Embodiments may be particularly effective for non-volatile memory or other read&write, sense&indicate, and/or sense&control functions in computer or other applications; such simultaneous operation of two (or more) of said multiple functionalities open new pathways for miniaturization of devices.

38 Claims, 13 Drawing Sheets

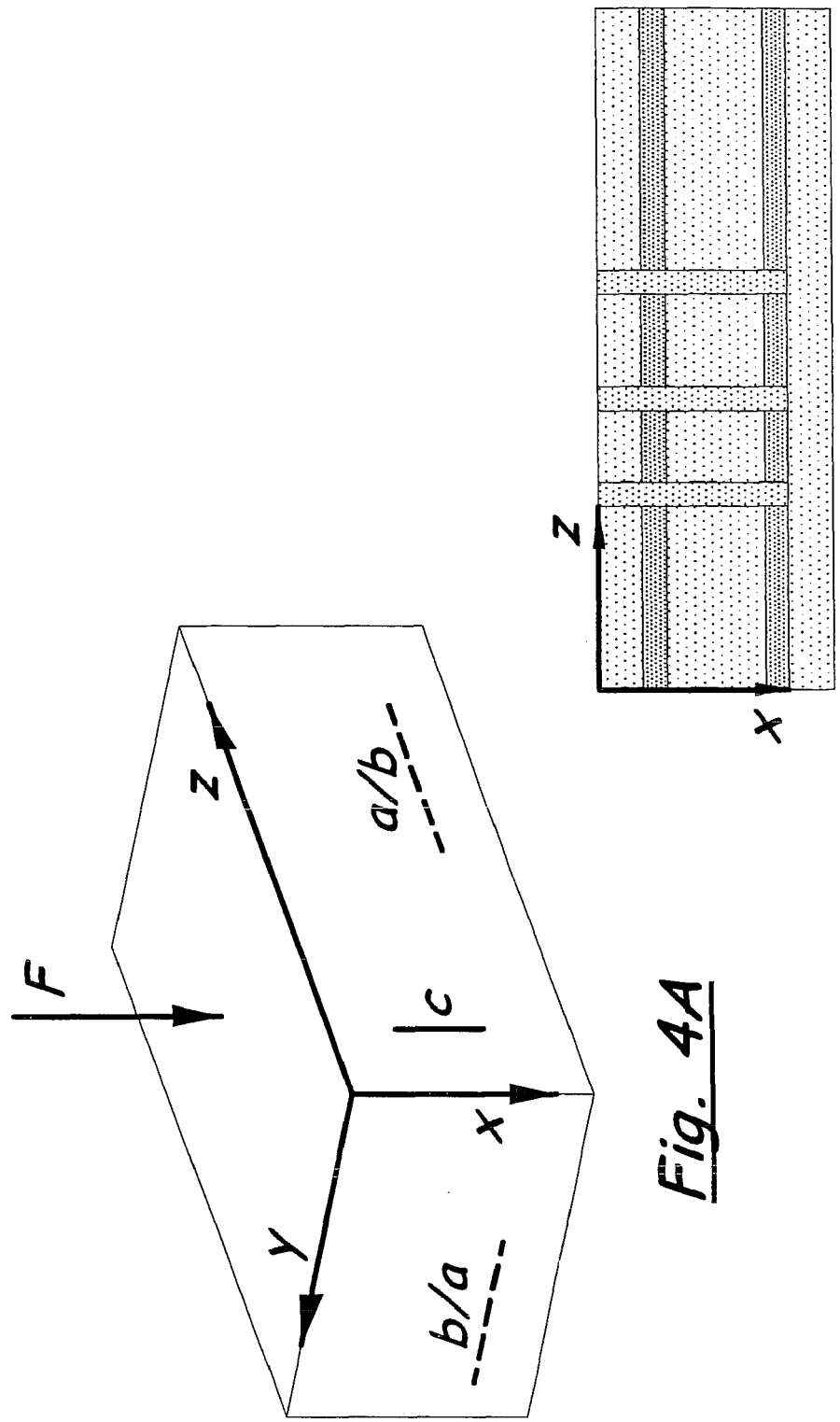

|  | $K$ [MJ/m³] | $M_S$ [MA/m] | $\tau_{M,max}$ [MPa] | $\varepsilon_{M,max}$ [%] | $\mu_0 H_a$ [T] |
|---|---|---|---|---|---|
| Ni₂MnGa | 0.25 | 0.5 | 2 | 10 | 1 |
| Dy | 44 | 3.0 | 220 | 10 | 30 |
| α-Fe | 0.05 | 1.1 | 0.07 | 35 | 0.06 |
| Co-Ni | 0.7 | 1.0 | 2 | 18 | 1.4 |
| τ-MnAlC | 1 | 0.5 | 1.4 | 35 | 4 |
| L1₀ FePd | 2.2 | 1.0 | 3 | 35 | 4 |
| L1₀ CoPt | 4.9 | 0.8 | 7 | 35 | 12 |
| L1₀ FePt | 6.6 | 1.1 | 9 | 35 | 12 |

*Fig. 10*

| CATEGORY | MATERIAL | REFERENCE |
|---|---|---|
| HEUSLER SHAPE-MEMORY ALLOY | Ni$_2$MnGa | [KOSTORZ 2005] |
| | Co$_2$NiGa | [WUTTIG 2001] |
| | Ni$_2$MnAl | [FUJITA 2000] |
| | Ni$_2$FeGa | [SANTA 2006] |
| NON-HEUSLER FERROMAGNETIC SHAPE-MEMORY ALLOY | Fe$_3$Pd | [JAMES 1998] |
| | | [CUI 2004] |
| | Fe-Pd-Pt | [WADA 2003] |
| | L1$_0$CoPt | [VLASOVA 2000] |
| ANTIFERROMAGNETIC SHAPE-MEMORY ALLOY | γ-Mn-Fe-Cu | [ZHANG 2005] |
| NON SHAPE-MEMORY ALLOY | Dy | [LIEB. 1976] |
| | τ-MnAl-C | [SOLO. 2004] |

*Fig. 11*

MULTI-STATE MEMORY AND MULTI-FUNCTIONAL DEVICES COMPRISING MAGNETOPLASTIC OR MAGNETOELASTIC MATERIALS

This application has priority of U.S. Provisional Application 60/859,163, filed Nov. 14, 2006, which is incorporated herein by reference

FIELD OF THE INVENTION

The invention relates to multi-state memory and/or multi-functional devices using magnetoplastic and/or magnetoelastic materials which couple magnetic and crystallographic/shape states. More specifically, the present invention relates to crystallographic and magnetic states of magnetoplastic and/or magnetoelastic materials, including magnetic shape memory alloys (MSMA) and other materials, to store, access, and modify data for sensor, actuator, logic and memory applications.

Current conventional logic, memory, and sensing and control technology is based on binary elements. Typically, a binary element contains semiconductor material that has two states, a conducting one, and an insulating one. On the other hand, the present invention relates to devices and methods wherein elements made of magnetoplastic and/or magnetoelastic materials are used, said elements preferably having six crystallographic states, and wherein the crystallographic states are linked to three magnetic states. This enables the combined usage of a single element as memory and logical unit. As a consequence, the low-level programming of computers becomes much more efficient. Because a single element may have six states (rather than two), memory density increases 3 fold. Because each of the six states are stable without the use of an external force (e.g., without external electric field or other continued force), the memory provided by said element can be nonvolatile.

Magnetoplastic materials, including ferromagnetic shape-memory alloys with twinned martensite, tend to deform upon the application of a magnetic field (Ullakko 1996, Murray et al. 2000, Chernenko et al. 2000). The magnetic-field-induced deformation can be irreversible (magnetoplasticity, Mullner et al. 2002, Mullner et al. 2003a) or reversible (magnetoelasticity, Chernenko et al. 2000, Ullakko et al. 1996). The magnetoplastic effect is related to the magnetic-field-induced displacement of twin boundaries, in an irreversible process. The magnetoelastic effect is also related to the magnetic-field-induced displacement of twin boundaries, but in a process that is at least somewhat reversible. While a strict definition of "elastic" would imply that magnetoelastic materials return without hysteresis to their initial state after removal of the magnetic-field, the term "magnetoelastic," as it is frequently used, may include materials that deform and return to their initial state upon removal of the magnetic field either without hysteresis or with some hysteresis.

While literature on the subject of magnetoplasticity and magnetoelasticity has indicated such materials to be relevant as actuators for converting electrical energy, or changes in magnetic field, to mechanical motion, the invention utilizes, in combination, magnetoplasticity/magnetoelasticity and the reverse or inverse effect (strain-induced change of magnetization) for data reading and writing, which may take the forms of memory and retrieval, displacement and sensing, sensing and control, or sensing and indicating, for example.

The inventors believe that magnetoplastic and/or magnetoelastic materials are uniquely suitable as multi-state data storage devices due to their large range of deformation, small threshold stress and significant change of magnetization. See Mullner et al 2003b, Straka and Heczko 2006, Suorsa et al. 2004, below, for discussions of range of deformation, threshold stress, and change of magnetization for magnetoplastic materials.

Closed-loop control of any automated process, including machines and robots, contains three main elements: a motor/actuator that drives the tool, a sensor which detects the position of the tool, and a controller which activates the motor. Sensor and controller are linked through elaborate electronics. In view of miniaturization, the electronics become a limiting aspect of the system. Multifunctional multi-state devices, according to embodiments of the invention, are a pathway to overcome these limitations by inherently linking them between magnetic and crystallographic and/or shape states wherein one function utilizing said multi-states will operate as a sensing means and the other function utilizing said multi-states will operate as control signal means. Similarly, displace&sense, sense&indicate, and read&write operations (such as memory storage and retrieval) are sets of functions that can be performed sequentially or simultaneously by causing/urging/actuating the material to enter various different magnetic and crystallographic and/or shape states (herein called "writing"), and then sensing/responding to said various different magnetic and crystallographic and/or shape states (herein called "reading").

RELATED ART

Background references that may be relevant to embodiments of the invention include:

Chernenko V A, Cesari E, Kokorin V V, Vitenko I N, Scripta Metal Mater 1995; 33:1239.

Chernenko V A, L'vov VA, Cesari E, J Magn Magn Mater 1999; 196-197:859.

Chernenko V A, L'vov VA, Pasquale M, Besseghini S, Sasso C, Polenur D A, Int J Appl Electromag Mech 2000; 12:3.

Chernenko V A, Müllner P, Wollgarten M, Pons J, Kostorz G, J de Phys I V, 2003; 112:951.

Ferreira P J, Vander Sande J B, Scripta Mater 1999; 41:117.

Ge Y, Heczko O, SŘderberg O, Lindroos V K, J. Appl. Phys 2004; 96: 2159.

Greer J R, Oliver W C, Nix W D, Acta Mater 2005; 53:1821.

Jääskeläinen A, Ullakko K, Lindroos V K, J de Phys IV, 2003; 112:1005.

Murray S J, Marioni M, Allen S M, O'Handley R C, Lograsso T A, Appl Phys Lett 2000a; 77:886.

Murray S J, Marioni M, Kulda A M, Robinson J, O'Handley R C, Allen S M, J Appl Phys 2000b; 87:5774.

Müllner P, Int J Mater Res (Z f Metallk) 2006;97:205.

Müllner P, Chernenko V A, Wollgarten M, Kostorz G, J Appl Phys 2002;92:6708.

Müllner P, Chernenko V A, Kostorz G, J Magn Magn Mater 2003a;267:325.

Müllner P, Chernenko V A, Kostorz G. Scripta Mater 2003b;49:129.

Müllner P, Chernenko V A, Kostorz G, Mater Sci Eng A 2004a;387:965.

Müllner P, Chernenko V A, Kostorz G, J Appl Phys 2004b; 95:1531.

Müllner P, Mukherji D, Erni R, Kostorz G, Proc Int Conf "Solid to solid phase transformations in inorganic materials" PTM'05, Phoenix, Ariz., Mai 29-Jun. 3, 2005, Vol. 2:171.

Müllner P, Ullakko K, Phys Stat Sol (b) 1998;208:R1.

Pan Q, James R D, J Appl Phys 2000;87:4702.

Pond R C, Celotto S, Intern Mater rev 2003;48:225.

Sozinov A, Likhachev A A, Lanska N, Ullakko K, Appl Phys Lett 2002;80:1746.

Sozinov A, Ullakko K, IEEE Trans Magn 2002;38:2814.

Straka L, Heczko O, Scripta Mater 2006;54:1549.

Sullivan M R, Chopra H D, Phys Rev B 2004;70:094427.

Suorsa I, Pagounis E, Ullakko K, Appl. Phys. Lett. 2004a; 23:4658.

Suorsa I, Tellinen J, Ullakko K, Pagounis E, J Appl Phys 2004b;95:8054.

Tickle R, James R D, J Magn Magn Mater 1999;195:627.

Ullakko K, J Mater Eng Perf, 1996;5:405.

Ullakko K, Huang J K, Kantner C, O'Handley R C, Kokorin V V, J Appl Phys 1996;69:1966.

Ullakko K, Aaltio I, www.adaptamat.com, "Actuator 2002", Bremen, Germany.

Vlasova N I, Kandaurova G S, Shchegoleva N N, J Magn Magn Mater 2000;222:138.

SUMMARY OF THE INVENTION

Apparatus and methods are proposed that comprise writing and reading of multi-state "bits" or multi-state elements on magnetoplastic and/or magnetoelastic materials or other materials that have greater than two magnetic, crystallographic, and/or shape states. Said "bits" or "elements" refer to individual/single portions/regions of material each adapted for receiving and holding information (writable) and also for said information being read (readable), and wherein "bit" is not intended to refer to traditional binary coding. "Multistate" refers to greater than two states, and the multi-state bits/elements of the preferred embodiments are formed or defined by the magnetic and crystallographic/shape states of magnetoplastic and/or magnetoelastic materials Preferred embodiments of the invention may achieve multi-functionality by the multiple crystallographic, magnetic, and shape states of the bits/elements of the magnetoplastic/magnetoelastic materials, which allows for simultaneous operations including read&write, sense&indicate, and sense&control. Simultaneous operation of two (or more) functionalities open new pathways for miniaturization of devices.

The preferred writing process is conducted through the application of a magnetic field and/or a mechanical action to said magnetoplastic and/or magnetoelastic materials. It has been shown that switching magnetic/crystallographic domains changes the orientation of the surface of these materials. The surface inclination can be detected using light of any wave length and by using other forms of radiation. Thus, light and other forms of radiation may be used for the reading process. For example, the reading process may be conducted through atomic-force microscopy, magnetic-force microscopy, spin-polarized electrons, magneto-optical Kerr effect, optical interferometry or other methods, or a combination of the above.

BRIEF DESCRIPTION OF THE DRAWINGS

FIGS. 4 (a) and (b) is a schematic depiction of a compressed/indented crystal sample.

FIG. 10 is a table of magnetic and magneto-mechanical properties of some but not all (potentially) ferromagnetic materials. Values surrounded by a rectangle being least favorable, and values surrounded by a triangle being most favorable.

FIG. 11 lists and categorizes many, but not all, magnetoplastic and potentially magnetoplastic materials, as well as citations to scientific literature discussing these materials. For materials that are circled in FIG. 11, magnetoplasticity has been demonstrated.

FIG. 12 shows an array of nanoindents performed in the Example below, on the shaded face of material such as that show by force F in FIG. 4a.

DETAILED DESCRIPTION OF THE PREFERRED EMBODIMENTS

Referring to the figures, there are shown several, but not the only, embodiments of the invented devices and methods.

The present invention makes use of two effects of materials with mobile twin boundaries, and, specifically, of magnetoplastic and/or magnetoelastic materials, including materials from the following subsets of magnetoplastic and/or magnetoelastic: magnetic shape memory alloys (MSMA, which are ferromagnetic or "magnetic"); materials resulting from martensitic transformation (typically called "martensite"); and other providers of twins.

Magnetoplasticity/magnetoelasticity is the magnetic-field-induced deformation enabled through the magnetic-field-induced displacement of crystallographic twin boundaries. Deformation-induced-change of magnetization occurring in magnetoplastic/magnetoelastic materials has been demonstrated by Mullner et al. (Müllner P, Chernenko V A, Kostorz G, Scripta Mater 2003b; 49:129). The strain-induced change of magnetization due to twin rearrangement is the reverse/inverse effect to magnetoplasticity. With regard to applications for magnetoplasticity, the present inventors believe that magnetoplasticity is relevant for actuators, whereas the inverse/reverse effect is relevant for sensors and/or power generation. Numerous publications deal with many aspects of the ferromagnetic martensites in Ni—Mn—Ga alloys such as martensitic transformations and martensite structure (e.g. Chernenko et al. 1995), magnetic-field-induced deformation (e.g. Murray et al 2000a, Sozinov et al 2002) and the associated magneto-stress (Chernenko et al. 2000, Mullner et al. 2002, Tickle and James 1999, Chernenko et al. 1999, Murray et al. 2000b). However, only few results concerning the inverse/reverse effect (strain-induced change of magnetization) have so far been published (Mullner et al 2003b, Soursa et al 2004a, Soursa et al 2004b, Straka et Heczko 2006).

The magnetoplastic effect is related to the magnetic-field-induced displacement of twin boundaries, which is a thermodynamically irreversible process (Ullakko 1996, Mullner et al. 2002). On the microscopic scale, a twin boundary moves by the motion of twinning disconnections (Pond and Celotto 2002), a process which can be triggered by a magnetic force on the dislocation (Mullner and Ullakko 1998, Ferreira and Vander Sande 1999, Mullner 2006). In $Ni_2MnGa$, the cooperative motion of twinning dislocations finally leads to a strain of up to 10% (Müllner et al. 2004a).

Figure 1:
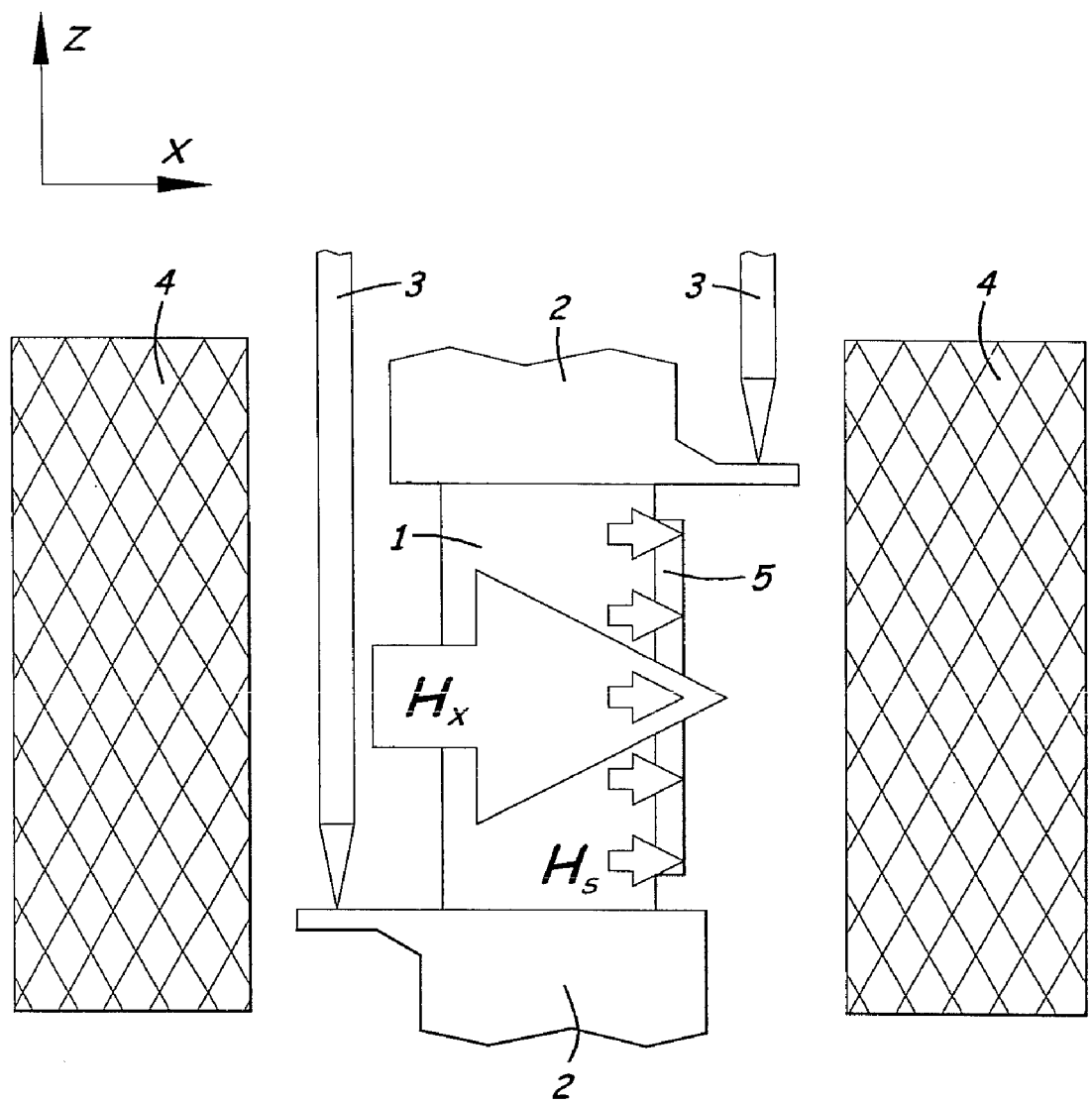
FIG. 1 is a schematic depiction of the experimental device with which deformation-induced change of magnetization was demonstrated.

FIG. 1 shows the setup of the experiment with which deformation-induced change of magnetization was demonstrated. A magnetoplastic material in form of a parallelepiped (1) is fixed between two pressure pistons (2) that introduce the load. Two quartz glass push rods (3) transmit the displacement of the top and bottom surfaces of the sample/pistons to the extensometers (not shown on the figure). A Hallbach cylinder (cylindrical permanent magnet, 4) produces the magnetic field $H_x$ (large arrow). A Hall probe (5) measures the sum of $H_x$ and stray field $H_S$ (small arrows) on the side surface of the sample. The difference between measured field and $H_x$ is taken as a measure for the sample magnetization in the direction indicated by the arrows.

Referring to FIG. 1, uniaxial compression experiments under orthogonal magnetic field were done on a single crystal with composition $Ni_{51}Mn_{28}Ga_{21}$ (numbers indicate atomic percent). The sample was cut as a rectangular prism with {100} faces in all directions and measured 5.45(2) mm×3.26(2) mm×2.34(2) mm. In the ferromagnetic austenitic phase, i.e. above the reverse transformation temperature of 316 K, the sample was a single crystal with the ordered cubic $L2_1$ structure. At room temperature, the material is in the martensitic phase. The crystallographic directions a and c of all twin variants were parallel within 3° to the sample edges. The easy magnetization axis is parallel to the c direction.

The sample was deformed in uniaxial compression and unloaded at constant speed ($2\times10^{-6}$ m/s) in a mechanical testing machine equipped with a 500 N load cell and extensometers insensitive to magnetic fields. The magnetic field $\mu_0 H=0.7$ T was produced by a permanent magnet system. The sample was mounted in such a way that the longest edge was parallel to the compression axis (z direction). The x direction was defined parallel to the shortest edge of the sample; x-y-z constitute Cartesian coordinates. The magnetic field was applied in x direction. A Hall probe was positioned close to one of the sample surfaces which were parallel to the y-z plane. The set-up of the experiment is outlined in FIG. 1.

Figure 2:
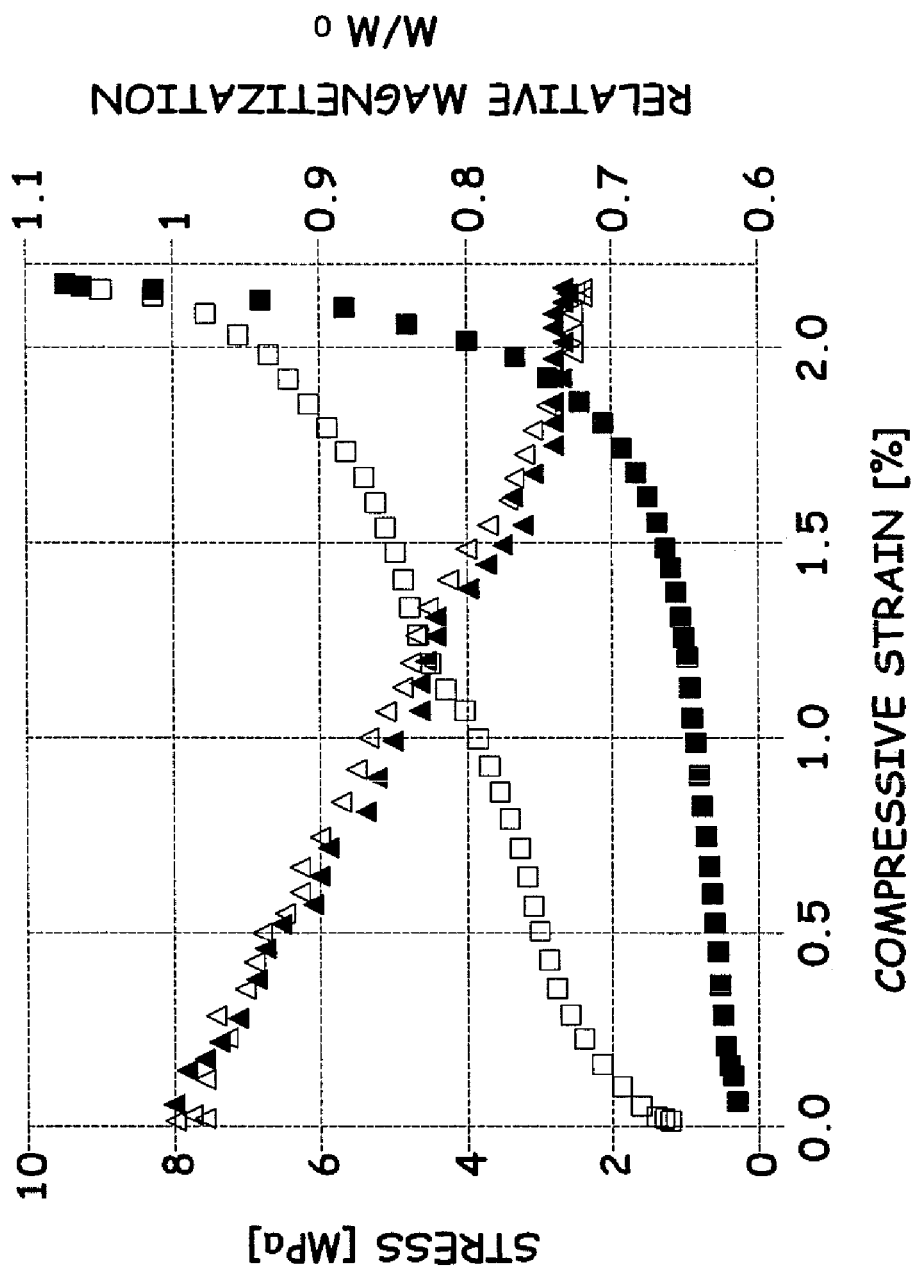
FIG. 2 is a graph of stress and magnetization of a $Ni_{51}Mn_{28}Ga_{21}$ crystal as a function of compressive deformation in the device depicted in FIG. 1.

FIG. 2 shows stress (squares) and magnetization (triangles) as a function of compressive deformation along <100> direction of a $Ni_{51}Mn_{28}Ga_{21}$ (numbers indicate atomic percent) single crystal measured at constant orthogonal magnetic field of 0.7 T along the x direction. Open and full symbols indicate values for increasing and decreasing deformation along the z direction. Upon deformation, the stress increases quickly to about 1.5 MPa at 0.04% strain. Above 0.1% strain, stress increases slowly and almost linearly up to 1.9% strain. At larger strain, stress increases rapidly again. Upon unloading, the total strain is recovered, however at a lower stress level compared with loading. The magnetization along the x axis (divided by its value $M_0$ in the undeformed state) decreases linearly with increasing deformation up to 1.9%. Upon unloading, the magnetization restores its initial value with a small hysteresis.

FIG. 2 shows the results of the experimentation represented by FIG. 1. Upon mechanical loading along the z direction at constant speed, the stress increases strongly at the beginning. The slope of the stress-strain curve decreases rapidly right after the onset of plastic deformation and is almost constant up to about 1.9% compressive strain and a corresponding stress of 6 MPa. At larger strain, the stress increases more rapidly. Over the whole deformation range, the relative magnetization in x direction $M_x/M_{x0}=(H-H_x)/(H_0-H_x)$ (H and M are the field detected with the Hall probe and the magnetization of the sample, $H_0$ and $M_0$ are the values in the undeformed state) decreases within experimental error linearly with increasing strain. Upon unloading, the stress decreases rapidly at the beginning and more slowly with decreasing strain until the full deformation is recovered. The relative magnetization increases again linearly until it reaches the initial value. The magnetization exhibits a negligible hysteresis. The slopes of the magnetization curves in both directions of deformation are constant and equal within experimental error over a wide range of strain whereas the stress curves have different shapes.

FIG. 3 is a schematic of the magnetization process through deformation in magnetoplastic martensitic materials. (a) Dark and bright gray indicate two twin variants. The local magnetization (arrows) aligns with the easy axis that is differently oriented for each twin variant. (b) Under an applied magnetic field $H_x$, the twin boundaries move causing growth of the twin variants with c parallel to the field. In the other twin variants, the magnetic moments rotate towards the direction of the magnetic field. (c) Under an applied load ($F_z$), the twin boundaries move causing growth of one twin variant with the crystallographic c axis parallel to the load direction and shrinkage of the other. The specimen deforms since the crystallographic axes c<a. At the same time, the distribution of magnetic moments changes and alters the total magnetization.

Figure 3C:
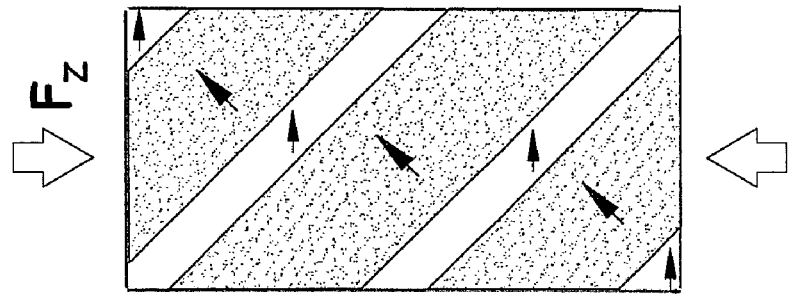
FIGS. 3 (a), (b), and (c) is a schematic depiction of the magnetization process through deformation in magnetoplastic martensitic materials.
Figure 3B:
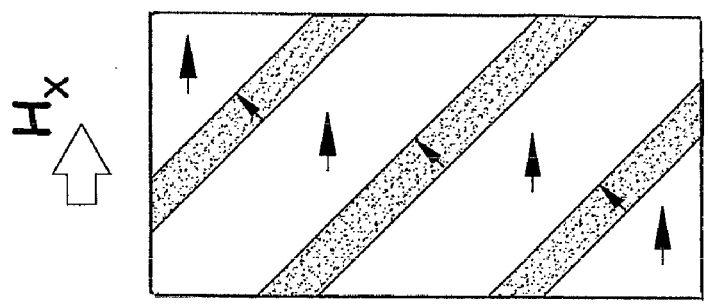
Figure 3A:
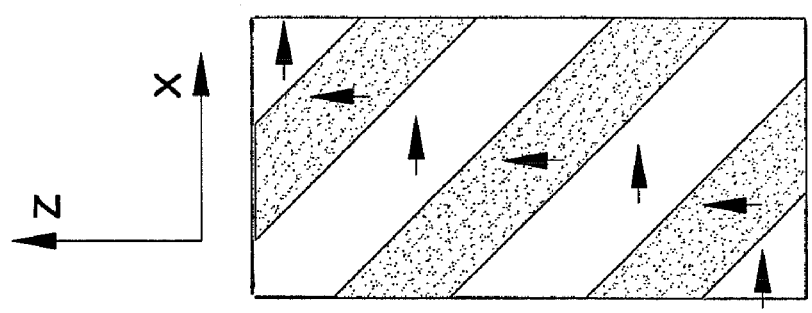

The twin rearrangement due to the action of a magnetic field and a mechanical force and the associated processes of deformation and magnetizing on the mesoscopic scale are shown schematically in FIG. 3. In the undeformed state and without magnetic field (FIG. 3a), the twin structure contains self-accommodated elastic domains with the crystallographic c directions distributed irregularly. In the absence of 180° magnetic domains (which is always true for magnetic fields of 0.1 T and larger and even, in some cases, without application of a magnetic field), there is a considerable stray-field $H_S$ caused by domains with the axis of easy magnetization (which is parallel to the c direction) perpendicular to the surface.

In the schematic of FIG. 3, only one martensite domain with one set of twins is present. Such a structure can be obtained after a suitable magnetic or mechanical treatment. In the present study, there are many martensite domains with differently oriented sets of twins.

When a magnetic field $H_x >> 0.1$ T is applied along the x direction, the twin boundaries move in such a way that the twins with c parallel to the x direction grow at the expense of twins with c perpendicular to the x axis (FIG. 3b). In regions, through which a twin boundary passes, the c direction switches from parallel to the z axis to parallel to the x axis. Since c/a<1, the sample shrinks along the x direction and expands along the z direction (magnetoplasticity). In addition to the motion of twin boundaries, the magnetic field $H_x$ causes the magnetic moments in the domains with c perpendicular to the x direction to rotate by an angle θ with $\sin\theta=H_x/H_A$ ($H_A$ is the saturation field) towards the x direction (FIG. 3b). In the present experiment, $H_x/H_A \cong 0.7$ and $\theta \cong 45°$. Owing to the rotation of the magnetic moments, the stray-field increases. The Hall probe (FIG. 1) detects the sum of the stray-field and the applied field.

When the sample is mechanically compressed along the z direction, the twin boundaries move in the opposite direction, i.e. the twins with c parallel to the z direction grow at the expense of twins with c perpendicular to the z axis (FIG. 3c). In regions, through which a twin boundary has passed, the c direction switched from parallel to the x axis to parallel to the z axis. Thereby, the direction of the magnetic moments rotates from parallel to the x axis to about 45° inclined to the x axis. This causes a reduction of the stray field which is detected by the Hall probe. Very close to the sample surface, the magnetic induction originating from the stray field is a linear function of the fractions of each twin variant. Since the strain is a linear function of the twin variant fractions, too, the signal of the Hall probe decreases linearly with strain (FIG. 2). Upon mechanical unloading, the reverse process occurs. The twin boundaries move again under the action of the magnetic field $H_x$ until the twin pattern and the shape of the unloaded state (FIG. 3b) are reached. Since in the present experiments, strain and magnetization are controlled by the fractions of twin variants, there is no significant hysteresis between loading and unloading curves (FIG. 2).

The role of the magnetic bias field ($H_x$ in the above experiment) is twofold. First, the bias field removes all 180° domain boundaries and causes a net magnetization $M_x$ in x direction. This component of the magnetization induces voltage in the coil, for extraction of electrical power. Second, the magnetic bias field works against the applied force and restores the shape of the magnetoplastic and/or magnetoelastic material after removal of the force. The restoration of the shape implies a further change of magnetization capable of generating electrical power. Below a bias field comparing to the saturation field (about 1 T for $Ni_2MnGa$), the recoverable strain decreases and vanishes below a threshold field (see Mullner et al. 2002). Alternatively, or additionally, restoration of the initial state may also be achieved through the application of a bias stress, for example, by a lever system forcing the shape of the magnetoplastic and/or magnetoelastic material back to the same or generally the same shape as the initial state.

FIG. 4 shows a sample geometry and indentation pattern/physical contour. (a) The parallelepiped-shaped sample was compressed along the direction parallel to its shortest edge while heated and cooled. Cartesian coordinates are defined on the sample as indicated. In most of the volume, the crystallographic c direction was parallel to the x axis. There are two possibilities for the orientation of the crystallographic a and b directions. (b) Schematic of the surface structure with bands/indentation pattern indicated.

A $Ni_{50}Mn_{29}Ga_{21}$ (numbers indicate atomic percent) single crystal was grown following the Bridgman method with a rate of 3.5 mm/h. A sample was cut using electric discharge erosion forming a parallelepiped with faces parallel to cubic {001} planes. The composition was measured using x-ray fluorescence analysis and energy-dispersive x-ray analysis with transmission and scanning electron microscopes. The composition varied by a couple of percent across the crystal. Electron diffraction revealed the presence of 14M (orthorhombic) and 10M (tetragonal) martensite with the 14M martensite being predominant. The dimensions of the sample were 5.4 mm×4.0 mm×2.0 mm. Cartesian coordinates are defined on the sample (sample coordinates) such that the shortest, intermediate, and longest edges are parallel to the x, y, and z directions. The crystal was annealed at 800° C. for one hour under an inert argon atmosphere. One surface with dimensions 5.4 mm×2.0 mm was polished with 1 μm diamond slurry (light gray shaded face in FIG. 4). After polishing, the sample was compressed with forces parallel to the x direction (i.e. parallel to the shortest edges, see FIG. 4a) to a stress level of 12±2 MPa and heated to 150° C. During the heating and cooling period, the force was held constant until the sample reached ambient temperature. The stress of 12 MPa applied during the heat treatment is sufficient to align the crystallographic c direction with the loading direction (see e.g. Müllner et al. 2004b). Thus, the crystallographic c direction which is the shortest lattice parameter must be parallel to the x direction in most of the sample. For the crystallographic a and b directions, there are two possibilities as indicated in FIG. 4a.

A Veeco Dimension 3100 Atomic Force Microscopy (AFM) System was used to characterize the relief of the surface and the magnetic structure of the surface. Surface reliefs were taken in tapping mode with a diamond tip with tip radius 25±3 nm and an apex angle of 60°. For the magnetic-force microscopy (MFM) experiments, a ferromagnetic tip with a Co-coating and magnetization parallel to the tip axis (i.e. perpendicular to the investigated surface) was used. The magnetic tip is particularly sensitive for variations to out-of-plane magnetization.

Long, straight thin bands parallel to the edges were found on the polished surface (FIG. 4b). The bands were identified as twins (see below). The experiments were terminated when an accidental collision of the AFM with the sample surface occurred. After the collision, the twin boundaries have moved and the twins have thickened considerably.

After the thermo-mechanical treatment, the polished surface displayed an almost periodic pattern of thin criss-crossing bands parallel to the sample edges. FIG. 4b is a schematic of the polished surface with "long" twins (i.e. twins parallel to the long edge of the sample which is the z direction) shaded gray and "short" twins (i.e. twins parallel to the short edge of the sample) shaded black.

Figure 5:
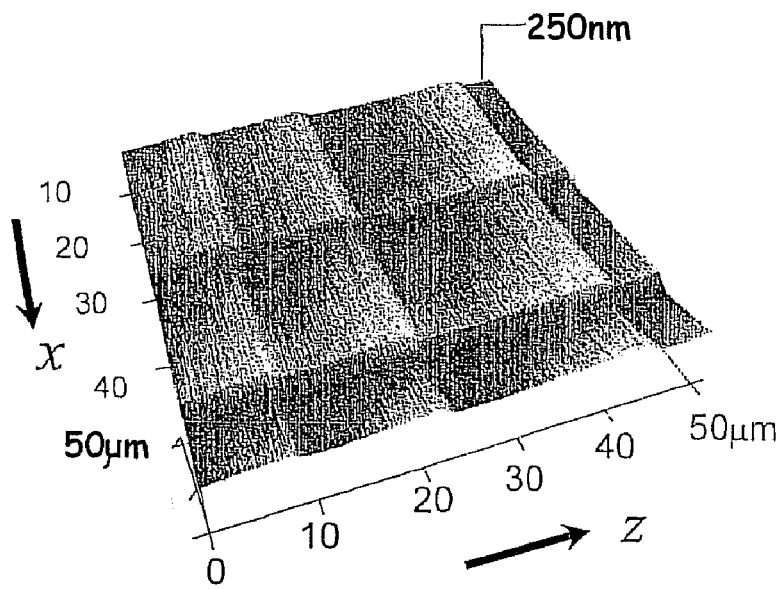
FIG. 5 is a detail of the shaded face of the sample depicted in FIG. 4(a).

FIG. 5 is a section of the surface relief of the shaded face in FIG. 4a, wherein the image is produced by atomic force microscopy (AFM). The surface relief contains terraces separated by slopes stemming from twins, which are the bands in FIG. 4b. FIG. 5 is a surface relief taken with the AFM in tapping mode. The surface shows terraces separated by inclined slopes. The root mean square surface roughness is 8 nm.

Figure 6A:
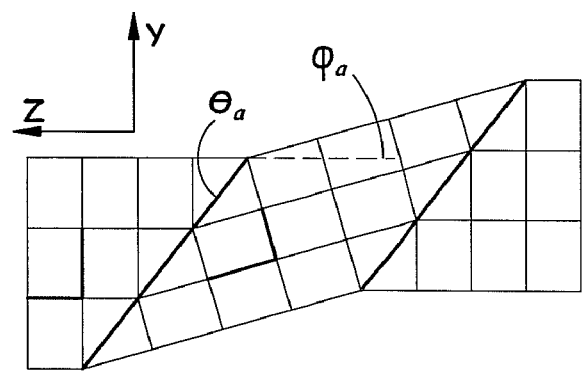
FIGS. 6 (a) and (b) is a schematic depiction of how twin crystallography is identified.
FIG. 6(c) is a graphic depiction of an example atomic-force microscopy (AFM) surface profile relating to the angles $\phi_a$ and $\phi_c$ from FIG. 6(b).
Figure 6B:
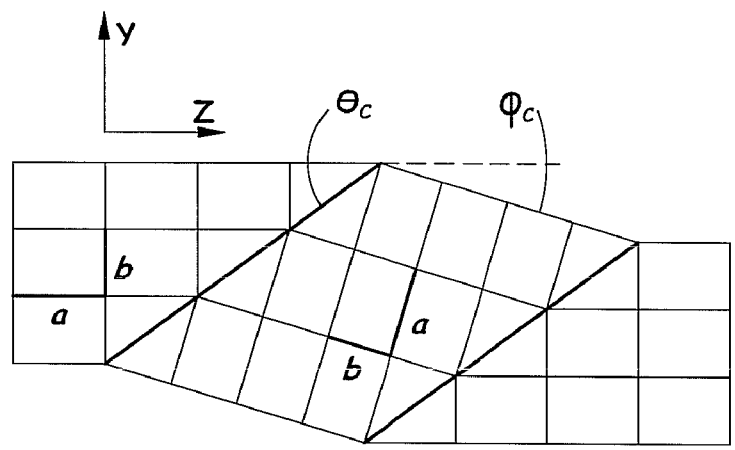
Figure 6C:
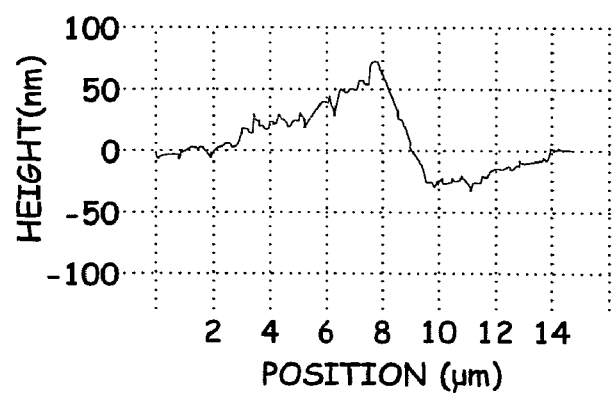

FIG. 6 shows how the twin crystallography is identified. (a) Cross-section of a twin parallel to the z direction. The orientation of each twin variant is indicated. (b) Cross-section of a twin parallel to the x direction. (c) Example of a AFM surface profile used for evaluating the relief angles $\phi_a$ and $\phi_c$. The slope angles $\phi_a$ and $\phi_c$ (defined in FIGS. 6a,b) were evaluated from surface profiles (e.g. FIG. 6c) and are ($\phi_a$=3.0°±0.3° and $\phi_c$=4.3°±0.5°. The slope angles are related to the lattice parameters by $$\phi_a = \arctan b/c - \arctan c/b \quad (6a)$$

$$\phi_c = \arctan a/b - \arctan b/a \quad (6b)$$

where the orientation of the crystallographic directions is given in FIGS. 6a and b. There are, in principal, many possibilities for the arrangement of twins and the orientation of the crystallographic directions in each twin. However, the crystallographic c direction was oriented by applying a normal stress of 12 MPa along the x direction (FIG. 4a). Thus, the predominant lattice parameter parallel to the x direction in the crystal must be the c lattice parameter which is the shortest.

Figure 7:
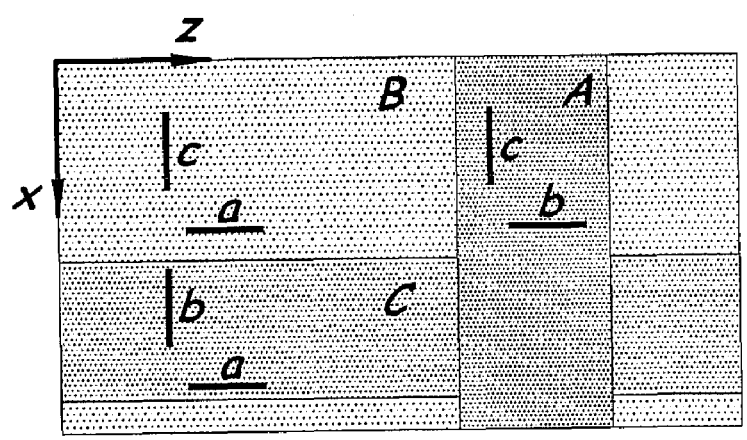
FIG. 7 is a schematic depiction of how crystallographic twin variants are identified.

FIG. 7 shows the crystallography and nomenclature of twin variants. Orientation and gray scale corresponds to FIG. 1b. Lower case a, b and c indicate the orientation of the crystallographic directions. Capital letters mark the crystallographic direction perpendicular to the surface and give the variants the name. Since the slope angle for an ac twin (with the b direction parallel to the twin boundary) is more than 6° (assuming c/a=0.9), the presence of ac twins is excluded. The only combination of crystallographic orientations is a||z, b||x, and c||y (B variant, since b is perpendicular to the surface) in the largest regions, a||z, b||y, and c||x (C variant) in the long twins, and a||x, b||z, and c||y (A variant) in the short twins (FIG. 7).

Figure 8A:
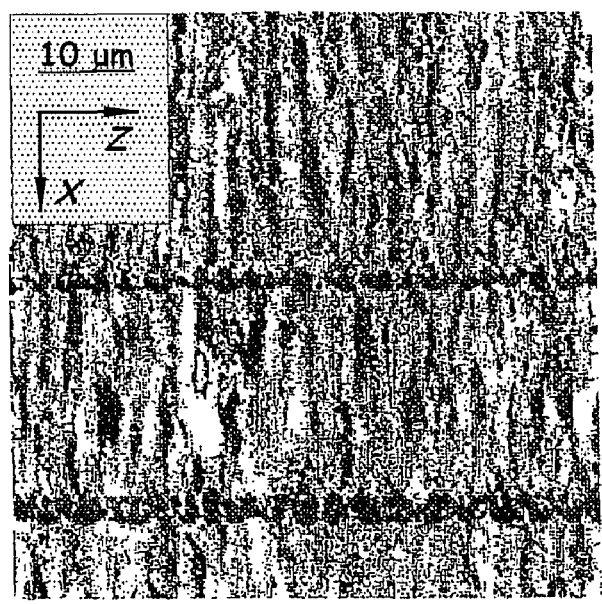
FIG. 8(a) is a depiction of a magnetic-force microscopy (MFM) result on the same area displayed in the shaded face (x-z plane) in FIG. 4(a and b) and in FIG. 5.
Figure 8B:
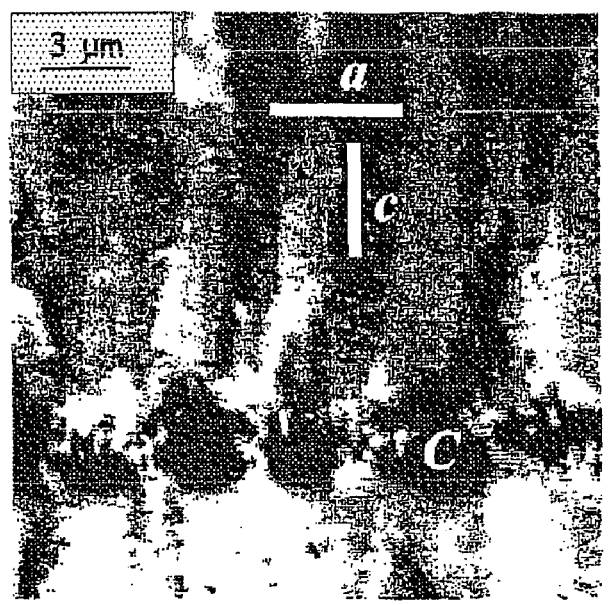
FIG. 8(b) is a magnified view of an area of FIG. 8(a) indicating an interaction of the domains across twin boundaries.

FIG. 8 shows results of magnetic-force microscopy (MFM) on the same area as displayed as relief in FIG. 5. FIG. 8(a) is a MFM image of the area shown in FIG. 5. The C variants appear as dark lines indicating strong interaction with the MFM tip and out-of-plane magnetization. The A and B variants are hardly distinguishable. Domains are elongated along the crystallographic c direction. FIG. 8(b) is a magnified view of an area similar to FIG. 8(a) indicating an interaction of the domains across twin boundaries.

FIG. 8a is an MFM image of the same area as shown in FIG. 5. The strong contrast in the two horizontal stripes along the z direction indicates out-of-plane magnetization in the long twins. For these twins, the crystallographic c direction is perpendicular to the surface (C variants), i.e. parallel to the x direction (compare FIG. 7). The crystallographic c direction is the direction of easy magnetization (Sozinov and Ullakko 2002). The regions with the A and B variants (FIG. 5) display a weak magnetic contrast in form of long stripes. FIG. 8b is a magnified view of FIG. 8a also containing regions with A, B and C variants. FIG. 8b was taken with higher magnetic sensitivity compared to FIG. 8a. The stripes are parallel to the y direction which is parallel to the crystallographic c direction in both A and B variants (FIG. 7).

For a cubic-to-orthorhombic martensite transformation, there are six orientation variants in the martensitic phase. Each variant has six {110}<1$\bar{1}$0> twinning systems; two of each ab-, bc-, and ac-twin type (Müllner et al. 2004b, Müllner et al. 2005). Thus, there are 36 possible twinning systems not including twins forming within twin variants. It is remarkable that given one known crystallographic direction in the predominant martensite variant, which in the present case is c, the analysis of the surface profile yields the complete crystallography of all twin variants. Thus, crystallographic orientation and spatial configuration of the twin structure can be fully characterized by AFM alone without employing diffraction methods.

The identification of the A, B, and C variants and the orientation of the twin boundaries prove the presence of ab-twins and bc-twins. For ab-twins (bc-twins), the twin boundary contains the crystallographic c (a) direction. It may be noted that the stress induced by the AFM accidentally impacting the sample (as described above) was sufficient to move the twin boundaries. Thus, ab-twins and bc-twins are very mobile. The present results substantiate the idea that different twinning modes are active in orthorhombic Ni—Mn—Ga MSMA resulting in a variation of the magnetic-field-induced strain.

The magnetic-force microscopy images reveal a strong signal for the C variants. Since the magnetization of the MFM tip is perpendicular to the surface, a strong signal indicates an out-of-plane magnetization, which is parallel to the crystallographic c direction. The c direction is the direction of easy magnetization in orthorhombic Ni—Mn—Ga martensite (Sozinov and Ullakko 2002). Thus, the conclusion that the C variant has out-of-plane magnetization is consistent with the magnetic properties of the material. The magnetic contrast in A and B variants reveals magnetic domains which are elongated along the crystallographic c direction. The width of the magnetic domains is the same for A and B variants. This indicates that magnetic domains have a rod-like shape. The domains match across twin boundaries (FIG. 6b) to ensure magnetic compatibility by avoiding magnetic charges on the twin boundaries (Vlasova et al. 2000). Similar magnetic domain structures were reported for tetragonal Ni—Mn—Ga martensite (Ge et al. 2004, Pan and James 2000, Sullivan and Chopra 2004).

Figure 9:
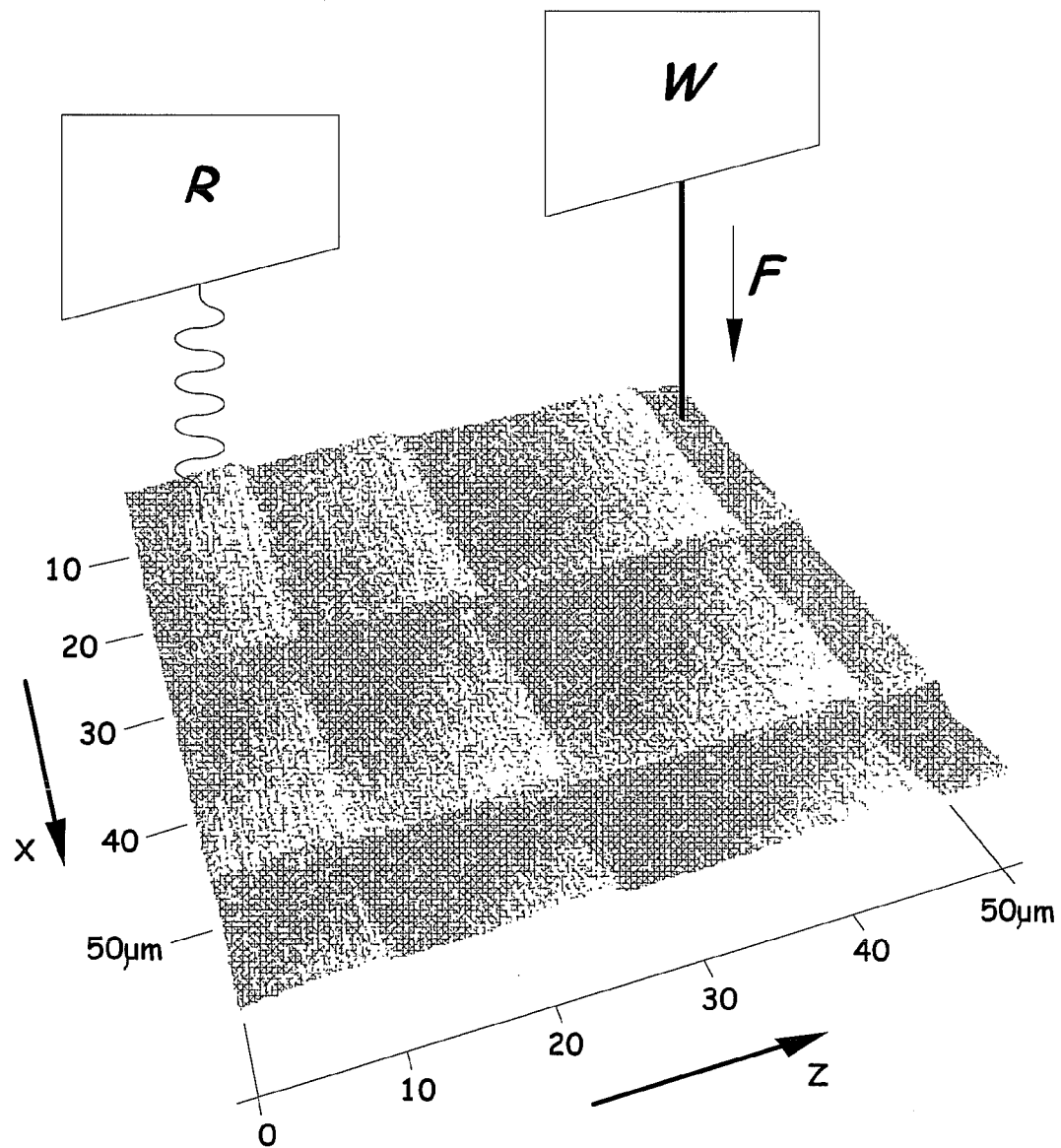
FIG. 9 is a schematic portrayal of one embodiment of the invention, wherein simultaneous writing and reading is performed on the sample of FIGS. 4 and 5.

Thus, it has been shown above on macroscopic samples that it is possible to control the magnetic and crystallographic states of a magnetoplastic material through the application of magnetic fields and/or mechanical forces. This represents one embodiment of a writing process. It has also been shown that it is possible to read the state of individual twin domains through the use of atomic force microscopy and magnetic force microscopy. A schematic of apparatus and methods of writing on (W, here a mechanical force F) and reading of (R, here apparatus for atomic force or magnetic force microscopy) a macroscopic portion of multi-state material is shown in FIG. 9. While FIG. 9 portrays a mechanical force for W, it will be understood from this disclosure and from FIG. 1 that a magnetic-field-change system may also be used for the writing system W.

With current micro-fabrication tools, micro- and nano-pillars with diameters of 100 nm and below can be produced. For instance, gold pillars with thickness between 100 nm and 200 nm were recently produced, mechanically deformed using a nanoindenter and characterized (Greer et al. 2005). Thus, the writing method outlined above and depicted in FIGS. 1 and 2 may directly be downscaled to the nano- and micro-scales.

One embodiment of the system uses mechanical force with or without combined use of magnetic field to write the "bits" on/in magnetoplastic and/or magnetoelastic material. We do not use "bit" in this disclosure to refer to the traditional meaning referring to binary coding, but, instead, we use it for convenience to refer to the multi-state elements of embodiments of the present invention, wherein said multi-states preferably comprise greater than two states, and more preferably six or more for a single magnetoplastic/magnetoelastic element. Likewise, the term "element" is not intended to refer to elements of the Periodic Table, but rather individual pieces/portions/regions (for example, individual memory units) according to the invention that are preferably formed/defined by pieces/portions/regions of magnetoplastic/magnetoelastic material.

One embodiment of the system uses a reading process that may be achieved through a combination of atomic-force microscopy and magnetic-force microscopy; diffraction-based work/reading is not required in preferred embodiments. In other embodiments, reading is accomplished through other means including optical interferometry, spin-polarized scanning electron microscopy, the magneto-optical Kerr effect, and/or combination of such methods.

One example, of how multi-functionality of the embodiments of the invention may be used, is as follows: one functionality may comprise the shape state serving as the main actuation function such as positioning a probe or defining a memory. Simultaneously, another functionality may be provided, for example, the magnetic state providing a signal to indicate the current position. In this embodiment, displace function and indicate function are combined in one material. Other embodiments combine other operations such as read & write, sense & indicate, sense & control, for example.

Preferred Materials:

The materials used for the preferred multi-state memory and multi-functional devices are those which couple magnetic and crystallographic/shape states. The preferred materials are those with mobile twin boundaries, wherein strain-induced deformation/change in said twin boundaries produces change in magnetization, and wherein magnetic-field change produces deformation/change in the twin boundaries (the later being the feature that is typically implied by the terms "magnetoplasticity" or "magnetoelasticity."). Therefore, the preferred materials used for the multi-state memory and/or multi-functional devices of the invention may be selected from the broad categories of magnetoplastic and magnetoelastic materials, including from the following subsets of magnetoplastic and/or magnetoelastic: magnetic shape memory alloys (MSMA, which are ferromagnetic or "magnetic"); materials resulting from martensitic transformation (typically called "martensite"); and other providers of twins. The terms "magnetoplastic" and "magnetoelastic" overlap to some extent, in that "magnetoelastic" is commonly used even for some materials that do exhibit hysteresis.

The phrases "magnetplasticity/magnetoelasticity" and "magnetoplatic/magnetoelastic materials" as applied in embodiments of the invention do not necessarily include all ferromagnetic materials, for example, these phrases preferably do not include "classical" magnetostriction (magnetostricitive materials). Whereas current magnetostrictive materials are limited to a maximum of about 0.2% strain (for Terfenol-D), the preferred megnetoplastic/megnetoelastic materials exhibit typically above 1% strain, and, in some embodiments, up to about 10% strain and possibly more.

Further, the magnetoplastic/magnetoelastic materials used in preferred embodiments of this invention are not piezoelectric. However, the inventors envision that there may be materials developed or discovered in the future that are both magnetoplastic/magnetoelastic and piezoelectric, and, hence, could be included in the preferred embodiments. The inventors envision that materials may be recognized or discovered in the future that are magnetoplastic/magnetoelastic and piezoelectric, and that may offer more memory states (electrical states) and also more actuation options (namely electrical field) for switching from one state to another (control).

Requisite for magnetoplasticity is the magnetic-field-induced motion of twin boundaries. This requisite implies the following properties:
(i) The material must deform more easily by twinning than by dislocation motion.
(ii) The twinning stress must be less than the magnetostress $\tau_M$, i.e. the stress which can be induced through a magnetic field.

Factors affecting (i) above include the crystal structure (trend: lower symmetry is better than higher symmetry), the lattice potential (trend: strong bonding is better than weak bonding), the size of the lattice parameter (trend: larger is better than smaller). Factors affecting (ii) include the magnetic anisotropy constant K (the higher the better) and the twinning shear (the smaller the better).

Regarding applications, a large strain might be desirable. This implies a large twinning shear, which is in conflict with (ii). Furthermore, it is desirable to obtain magnetoplasticity with a small magnetic field. This implies a large saturation magnetization $M_s$. Thus, the desired materials properties are:
1. Large magnetic anisotropy K.
2. Large saturation magnetization $M_s$.
3. For large stress output: small twinning shear.
4. For large strain output: large twinning shear.

Regarding memory applications of preferred embodiments of the invention, a large strain output is important; however, the requirement that the stress required for twinning must be smaller than the magnetostress still holds. The multi-state data storage medium according to preferred embodiments of the invention should be material with the basic properties (i), (ii), and (1-4) above, and may be manufactured as solid bulk part, as thin film, as nanostructured bulk part, as nanostructured thin film, as nano-columns and in any other shape and form. Nano-structured arrays of the material may be of particular interest as the bit size can be tailored in this case using nano-fabrication methods.

FIG. 10 summarizes magnetic and magneto-mechanical properties of some (potentially) ferromagnetic materials. Materials in FIG. 10 for which magnetoplasticity has been reported in the literature are circled. Embodiments of the invention may include one or more of the materials in FIG. 10, with values surrounded by a rectangle being least favorable, and values surrounded by a triangle being most favorable. The strain $\epsilon_{M,max}$ is proportional to the twinning shear and marks the theoretical maximum of magnetic-field-induced strain. The saturation field $\mu_0 H_a$ is the magnetic field at which the maximum magnetostress $\tau_{M,max}$ is reached. Further increase of the magnetic field does not increase the magnetostress.

Current research in the field of magnetoplasticity focuses on ferromagnetic shape-memory alloys (MSMA), because in these materials, the twinning stress is very low. Particular attention is being paid to Heusler alloys, particularly off-stoichiometric $Ni_2MnGa$. Other ferromagnetic shape-memory alloys (i.e. non-Heusler alloys) which are under study include FePd, CoPt, FePt, and $Fe_3Pd$. Recently, magnetoplasticity was reported for an antiferromagnetic (AFM) magnetic shape-memory alloy γ-Mn—Fe—Cu (J. H. Zhang, W. Y. Peng, S. Chen, T. Y. Hsu (X. Zaoyao), Appl. Phys. Lett. 86, 022506 (2005)). Non-shape-memory alloys which have been studied in context of magnetoplasticity include dysprosium and τ-MnAl—C.

FIG. 11 lists and categorizes many magnetoplastic and potentially magnetoplastic materials, as well as citations to scientific literature discussing these materials. Embodiments of the invention may include one or more of the listed materials and/or one or more materials selected from the broad categories of materials. For materials that are circled in FIG. 11, magnetoplasticity has been demonstrated. The citations in FIG. 11 are:

[Cui 2004] J. Cui, T. W. Shield, R. D. James, Acta mater. 52, 35 (2004).
[Fujita 2000] A. Fujita, K. Fukamichi, F. Gejima, R. Kain-Lima, K. Ishida, Appl. Phys. Lett. 77, 3054 (2000).
[James 1998] R. D. James and M. Wuttig, Phil. Mag. A 77, 1273 (1998).
[Kostorz 2005] G. Kostorz and P. Müllner, Z. f. Metallk. 96, 703 (2005).
[Lieb. 1976] H. H. Lieberrnann and C. D. Graham, Jr. Acta Met. 25, 715 (1976).
[Santa. 2006] R. Santamarta, E. Cesari, J. Font, J. Muntasell, J. Pons, J. Dutkiewicz, Scripta Mater. 54, 1985 (2006).
[Solo. 2004] A. S. Sologubenko, P. Müllner, H. Heinrich, K. Kostorz, Z. f. Metallk. 95, 486 (2004).
[Vlasova 2000] N. I. Vlasova, G. S. Kandaurova, N. N. Shchegoleva, J. Magn. Magn. Mater. 222, 138 (2000).
[Wada 2003] T. Wada, T. Tagawa, M. Taya, Scripta Mater. 48, 207 (2003).
[Wuttig 2001] M. Wuttig, J. Li, C. Craciunescu, Scripta Mater. 44, 2393 (2001).
[Zhang 2005] J. H. Zhang, W. Y. Peng, S. Chen, T. Y. Hsu (X. Zaoyao), Appl. Phys. Lett. 86, 022506 (2005).

As may be seen from the above comments and FIGS. 10 and 11, preferred materials may be selected from the group consisting of: Heusler shape-memory alloy, non-Heusler ferromagnetic shape-memory alloy, antiferromagnetic shape-memory alloy, non-shape-memory magnetoplastic alloy, $Ni_2MnGa$, Dy, α-Fe, Co—Ni, τ-MnAl—C, $L1_0$ FePd, $L1_0$CoPt, $L1_0$FePt, $Ni_2MnGa$, $Co_2NiGa$, $Ni_2MnAl$, $Ni_2FeGa$, $Fe_3Pd$, Fe—Pd—PT, γ-Mn—Fe—Cu, $Ni_{51}Mn_{28}Ga_{21}$, Ni—Mn—Ga alloys, Ni—Mn—Ga ferromagnetic martensite, and combinations thereof. Especially-preferred for non-volatile memory embodiments will be materials, including materials selected from the broad category of magnetoplastic/magnetoelastic and from the above list, that exhibit magnetic and crystallographic states that are stable without the use of an external electrical input or other force.

DISCUSSION OF FEATURES AND ADVANTAGES OF PREFERRED EMBODIMENTS

Current conventional device, logical and memory technology is based on binary elements. On the other hand, elements, according to embodiments of the invention, made of magnetic shape-memory material have six crystallographic states. The crystallographic states are linked to three magnetic states. This enables the combined usage of a single element as memory and logic unit. As a consequence, the low-level programming of computers becomes much more efficient. Because a single element may have six states, memory density increases 3 fold.

Current memory devices including dynamic random access memory (DRAM) are based on volatile mechanisms. Those mechanisms depend on the permanent supply of power. When power fails, data is lost. The multi-state memory of preferred embodiments of the invention may be based on materials, from the broad category of magnetoplastic/magnetoelastic materials, selected for exhibiting magnetic and crystallographic states that are stable without the use of an external force (e.g., external electric field); such multi-state memory may, therefore, be non-volatile Embodiments of the present invention may continue the historic trend toward functionalities being carried by materials rather than by machine parts. Further, embodiments of the invention, by providing multiple functions from one material, may reduce the complexity of systems which may lead to an increase of performance, miniaturization, and lowering of costs.

EXAMPLE

The following is an example comprising study and analysis of material, and comprising writing and reading methods of the multi-states of said material, that may be applied to one, but not the only, embodiment of the invention.

Atomic-force microscopy, magnetic-force microscopy (MFM), and nanoindentation experiments were performed on a Ni—Mn—Ga single crystal with orthorhombic (14M) martensite. The surface relief was characterized and used to identify the orientation of individual twin variants. It was shown that ab- and bc-twinning modes are present. The magnetic domains are elongated along the crystallographic c direction. Twin variants with the c direction perpendicular to the surface exhibit an out-of-plane magnetization which can be identified through a strong contrast in the MFM image. The deformation caused with nanoindentation is recoverable to a large degree. No trace of deformation twinning was found after unloading. The results are discussed in the light of pseudo-elastic twinning and dislocation activity. It is concluded that although the residual deformation is due to dislocation activity, it is likely that pseudo-elastic twinning took place during loading and unloading. The results indicate a size effect on deformation twinning under localized loading.

1. Introduction

Magnetic shape-memory alloys (MSMA) are distinguished from other ferromagnetic materials by the coupling mechanism between shape and magnetization. Large (uniaxial) magnetic anisotropy constant and mobile twin boundaries are at the origin of large magnetic-field-induced deformation (magnetoplasticity). Plastic (i.e. irreversible) strains up to 10% have been reported for off-stoichiometric $Ni_2MnGa$ Heusler alloy single crystals (see e.g. references [1-4], below). The reverse effect or deformation-induced change of magnetization requires a magnetic field bias to minimize demagnetizing by the formation of 180° domains (references [5-7]).

There are various ideas for applications of MSMA. For instance, actuator applications including stepper motors, pumps, valves and devices for surgery make use of the "direct" effect of magnetic-field-induced deformation. Sensor applications make use of the "reverse" effect or deformation-induced change of magnetization. In all application, considerable magnetic fields need to be produced. Devices involving MSMA transducers in the millimeter size range and larger may require considerable power. In addition, losses from induction limit the actuation frequency of large systems. That these obstructions are reduced when the scale is smaller provides motivation for miniaturization. However, mechanical properties change dramatically when objects are small (at least in one direction) compared to a characteristic length specific for a certain deformation mechanism [reference 8], and the yield stress may increase strongly with decreasing size [reference 9]. Thus the investigation of mechanical properties on the micrometer and smaller scales is needed for the development of miniaturized applications.

The micromechanism of magnetoplasticity is the motion of twinning disconnections [references 10-14]. Disconnections are interfacial line defects with elastic fields (displacement, strain and stress) identical to the elastic fields of dislocations. Greer et al. [reference 9] assume that the efficiency of dislocation multiplication decreases with decreasing size of single crystalline gold columns with diameter below 1 μm. Lack of dislocations is the reason for the high yield strength of these gold columns when only a few hundred nanometer in diameter.

Whether such observations apply to twinning in magnetic shape-memory alloys and what limits magnetic-field-induced twinning and deformation-induced change of magnetization at small length scale are open questions. The present paper reports on an investigation of two questions, (i) whether it is possible to locally induce deformation twinning with a sharp tip thereby inducing a magnetic signature which can be identified with magnetic-force microscopy (MFM) and (ii) if there is a size effect on the deformation mechanisms which are triggered due to localized loading.

2. Magnetoplasticity 2.1 Micromechanism of Magnetoplasticity

The magnetoplastic effect is related to the magnetic-field-induced displacement of twin boundaries. On the microscopic scale, a twin boundary moves by the motion of twinning disconnections [references 10-16], a process which can be triggered by a force on the disconnection. A disconnection is an interfacial line defect with a dislocation component and a step component. A disconnection is characterized by a line vector (which is parallel to the interface), a step vector (which is perpendicular to the interface) and a Burgers vector (which is of arbitrary direction). For a twinning disconnection, the Burgers vector is parallel to the interface. The motion of a twinning disconnection is conservative and compares to glide of a lattice dislocation.

The Burgers vector defines the deformation carried by a moving disconnection. Thus, the dislocation component controls the interaction of a stress field with the disconnection. A shear stress $\tau$ exerts a mechanical force $F_{mech}$ on a disconnection:

$$F_{mech} = \tau b \quad (1)$$

where b is the magnitude of the Burgers vector. The step vector defines the volume which is transformed by a moving disconnection. Thus, the step component controls the interaction of a magnetic field with the disconnection. For a material with uniaxial magnetic anisotropy K, the magnetic force $F_{mag}$ exerted by a magnetic field on the disconnection was derived in [reference 12]. In the special case where the magnetic field is parallel and perpendicular to the easy axis of magnetization of the twinned crystals sharing the interface, the magnetic force is $$F_{mech} = \begin{cases} \mu_0 M H d\left(1 - \dfrac{\mu_0 M H}{4k}\right) & \text{for } H \le H_A \\ K d & \text{for } H \ge H_A \end{cases} \quad (2)$$

where $\mu_0$ is the free space permeability, M is the saturation magnetization, H is the magnetic field, d is the step height of the disconnection, and $H_A = 2K/\mu_0 M$ is the saturation field. Equating mechanical and magnetic force yields the magnetostress which is the mechanical stress that is produced by a magnetic field. The maximum magnetostress is the ratio K/s where s=b/d is the twinning shear.

2.2 Twin-Surface Interaction

When a twin grows from a surface into a crystal, the energy increases as a result of three factors: the growing interface, the growing strain field and, if the material is ferromagnetic, the demagnetizing field. The energy contribution of the twin boundary is proportional to the interface area whereas the work done by the growing twin is proportional to the twinned volume, the twinning shear and the applied stress. Therefore, the shear stress $\tau$ required to grow the twin decays with increasing twin thickness t:

$$\tau = \dfrac{\alpha \gamma_{tb}}{st} \quad (3)$$

where $\alpha$ is a geometrical factor on the order of utility, $\gamma_{tb}$ is the twin boundary energy, and s is the twinning shear.

The disconnections experience an image force due to the dislocation component. The image force is inversely proportional to the distance from the surface and tends to pull dislocations out of the crystal (e.g. reference [17]). When a deformation twin is formed from a surface and grows into the crystal, the twin disappears after unloading if the image force on each dislocation is larger than the force due to internal stresses. This effect may be called elastic twinning [reference 18] or pseudo-elastic twinning. Pseudo-elastic twinning was observed by Garber in calcite in the late 1930s. Garber published his observations in Russian. Garber's results were reviewed in English by Kosevich [reference 18]. Pseudo-elastic twinning requires stress concentrations on the surface [reference 18].

The energy contribution due to the reorientation of the axis of easy magnetization depends on the magnetic domain structure and the relative sizes of twin and magnetic domains. If a magnetic field larger than the saturation field is applied, the magnetic effects on twin growth are limited to the magnetic force on twinning disconnections, Eq. (2). The same is true for a moderate magnetic field as long as the field is large enough to remove 180° domain boundaries. For weak magnetic fields, the reorientation of the axis of easy magnetization may result in localized magnetic domains with out-of-plane magnetization.

These domains have a strong magnetic field with large energy. This energy provides a further driving force for detwinning after unloading and may contribute to pseudo-elastic twinning.

2.3 Twin-Interface Interaction

Interfaces interrupt the slip plane (which for twinning disconnections is the twinning plane) and, thus, determine the free path of twinning disconnections. Interfaces themselves do not have long-range stress field. Therefore, a 'first' twinning disconnection that approaches a 'defect free' interface (i.e. an interface that does not already contain a twinning disconnection) moves under the action of a magnetic or mechanical force until it is blocked by the interface. The stress field of the blocked dislocation obstructs the motion of the second twinning disconnection. A critical mechanical or magnetic stress $\tau_c$ is required, to push the second disconnection into the interface. The critical stress is inversely proportional to the total number N=d/t of twinning disconnections [references 19, 20]:

$$\tau_c = \dfrac{Gd}{4\sqrt{2}\,(1-v)t} \quad (4)$$

where G and v are the shear modulus and Poisson's ratio, d and t are the d-spacing of twining planes and the twin thickness. For very small twins (e.g. t=10 nm) the critical shear stress $\tau_c$ is about $10^{-2}$ G, which is two orders of magnitude larger than the magnetostress. Thus, the second disconnection of a thin twin does not reach the interface. For very thick twins (e.g. t=100 μm) the critical shear stress $\tau_c$ is about $10^{-6}$ G, which is a factor of 30 less than the magnetostress. Thus, the second, third and following disconnections reach the interface and form a nascent dislocation wall. As the dislocation wall grows, the more disconnection that are pushed into the interface, the stronger is the repulsive force that these disconnection exert on a incoming disconnections. The fraction η of twinning disconnections that form a disconnection wall in an interface can be approximated as [references 14, 20, 21]:

$$\eta = 1 - \sqrt{2}\,s\dfrac{\tau_c}{\tau} \quad (5)$$

where $\tau(>\tau_c)$ is the resolved shear stress on the twinning plane in the twinning direction.

A dislocation wall is a mechanically stable dislocation configuration. Dislocations are trapped in a dislocation wall.

It therefore requires a force to remove a dislocation from a wall. This force increases with increasing wall size and causes hysteresis [reference 13].

3. Experiments

A $Ni_{50}Mn_{29}Ga_{21}$ (numbers indicate at. %) single crystal was grown following the Bridgman method with a rate of 3.5 mm/h. A sample was cut using electric discharge erosion forming a parallelepiped with faces parallel to cubic {001} planes. The composition was measured using x-ray fluorescence analysis and energy-dispersive x-ray analysis with transmission and scanning electron microscopes. The composition varied by a couple of percent across the crystal. Electron diffraction revealed the presence of 14M (orthorhombic) and 10M (tetragonal) martensite with the 14M martensite being predominant. The dimensions of the sample were 5.4 mm×4.0 mm×2.0 mm. Cartesian coordinates are defined on the sample (sample coordinates) such that the shortest, intermediate, and longest edges are parallel to the x, y, and z directions. The crystal was annealed at 800° C. for one hour under an inert argon atmosphere. One surface with dimensions 5.4 mm×2.0 mm was polished with 1 μm diamond slurry (light gray shaded face in FIG. 4a). After polishing, the sample was compressed with forces parallel to the x direction (i.e. parallel to the shortest edges, see FIG. 4a) to a stress level of 12±2 MPa and heated to 150° C. During the heating and cooling period, the force was held constant until the sample reached ambient temperature. The stress of 12 MPa applied during the heat treatment is sufficient to align the crystallographic c direction with the loading direction (see e.g. reference [4]). Thus, the crystallographic c direction which is the shortest lattice parameter must be parallel to the x direction in most of the sample. For the crystallographic a and b directions, there are two possibilities as indicated in FIG. 4a.

FIGS. 4a and b: Sample geometry and indentation pattern. (a) The parallelepiped-shaped sample was compressed along the direction parallel to its shortest edge while heated and cooled. Cartesian coordinates are defined on the sample as indicated. In most of the volume, the crystallographic c direction was parallel to the x-axis. There are two possibilities for the orientation of the crystallographic a and b directions. (b) Schematic of the surface structure with bands.

A Veeco Dimension 3100 Atomic Force Microscopy (AFM) System was used to characterize the relief and the magnetic structure of the surface and to perform nanoindentation experiments. Surface relief were taken in tapping mode with a diamond tip with tip radius 25±3 nm and an apex angle of 60°. For the nanoindentation experiments, diamond tip, cantilever and photo detector were calibrated using a sapphire single crystal. The tip was pressed onto the sapphire surface up to a load corresponding to a photo detector reading of 2 V. Up to this load, the diamond tip did not indent the sapphire surface. For the magnetic-force microscopy (MFM) experiments, a ferromagnetic tip with a Co-coating and magnetization parallel to the tip axis (i.e. perpendicular to the investigated surface) was used. The magnetic tip is particularly sensitive for variations to out-of-plane magnetization.

Figure 12:

Long, straight thin bands parallel to the edges were found on the polished surface (FIG. 4b). In the regions bound by the thin bands and within the bands themselves, arrays of nanoindentation experiments were performed. FIG. 12 shows an array of indents. Each triangular shaped indent is surrounded by pileups of displaced or deformed material. In each line of 10 experiments, the maximum applied load increase from light to left from a photo detector reading of 0.2 V (corresponding to 6.1 μN) in increments of 0.2 V to a maximum reading of 2.0 V (corresponding to 61 μN). The bands were identified as twins (see paragraph 4). Indents were set at least 1 μm apart from each other and also from the nearest twin boundary. In a second series, the distance from the nearest twin boundary was varied from indenting on the boundary to a distance of more than 1 μm. Magnetic-force microscopy images were taken of some of the indents which resulted from loading up to a photo detector reading of 2 V.

FIG. 12: Array of nanoindents performed on the shaded face in FIG. 4a. The indents to the outermost right (barely visible) were obtained with loading to a maximum detector voltage of 0.2 V corresponding to 6.1 μN. The maximum load increases from indent to indent towards the left by 6.1 μN and measures 61 μN for the indents on the outermost left.

The experiments were terminated when an accidental collision of the AFM with the sample surface occurred. After the collision, the twin boundaries have moved and the twins have thickened considerably.

4. Results

After the thermo-mechanical treatment, the polished surface displayed an almost periodic pattern of thin crisscrossing bands parallel to the sample edges. FIG. 4b is a schematic of the polished surface with "long" twins (i.e. twins parallel to the long edge of the sample which is the z direction) shaded black and "short" twins (i.e. twins parallel to the short edge of the sample) shaded gray. FIG. 5 is a surface relief taken with the AFM in tapping mode. The surface shows terraces separated by inclined slopes. The root mean square surface roughness is 8 nm. The slope angles $\phi_a$ and $\phi_c$ (defined in FIGS. 6a and b) were evaluated from surface profiles (e.g. FIG. 6c) and are $\phi_a=3.0°±0.3°$ and $\phi_c=4.3°±0.5°$. The slope angles are related to the lattice parameters by $$\varphi_a = \arctan\frac{b}{c} - \arctan\frac{c}{b} \tag{6a}$$

$$\varphi_c = \arctan\frac{a}{b} - \arctan\frac{b}{a} \tag{6b}$$

where the orientation of the crystallographic directions is given in FIGS. 6a, b.

FIG. 5: Surface relief of the shaded face in FIG. 4a. The surface relief contains terraces separated by slopes stemming from twins, which are the bands in FIG. 4b.

FIG. 6: Schematic of twin crystallography. (a) Cross-section of a twin parallel to the z direction. The orientation of each twin variant is indicated. (b) Cross-section of a twin parallel to the x direction. (c) Example of a surface profile used for evaluating the relief angles $\phi_a$ and $\phi_c$.

There are, in principle, many possibilities for the arrangement of twins and the orientation of the crystallographic directions in each twin. However, the crystallographic c direction was oriented by applying a normal stress of 12 MPa along the x direction (FIG. 4a). Thus, the predominant lattice parameter parallel to the x direction in the crystal must be the c lattice parameter which is the shortest. Since the slope angle for an ac twin (with the b direction parallel to the twin boundary) is more than 6° (assuming c/a=0.9), the presence of ac twins is excluded. The only combination of crystallographic orientations is a∥z, b∥y, and c∥x (B variant, since b is perpendicular to the surface) in the largest regions, a∥z, b∥x, and c∥y (C variant) in the long twins, and a∥y, b∥z, and c∥x (A variant) in the short twins (FIG. 7).

FIG. 8a is an MFM image of the same area as shown in FIG. 5. The strong contrast in the two horizontal stripes along the z direction indicates out-of-plane magnetization in the long twins. For these twins, the crystallographic c direction is perpendicular to the surface (C variants), i.e. parallel to the y direction (compare FIG. 7). The crystallographic c direction is the direction of easy magnetization [reference 3]. The regions with the A and B variants (FIG. 7) display a weak magnetic contrast in form of long stripes. FIG. 8b is a magnified view of FIG. 8a also containing regions with A, B and C variants. FIG. 8b was taken with higher magnetic sensitivity compared to FIG. 8a. The stripes are parallel to the y direction which is parallel to the crystallographic c direction in both A and B variants (FIG. 7).

FIG. 7: Crystallography and nomenclature of twin variants. Orientation and gray scale corresponds to FIG. 4b. Lower case a, b, and c indicate the orientation of the crystallographic directions. Capital letters mark the crystallographic direction perpendicular to the surface and give the variants the name.

FIGS. 8a and b: Magnetic-force microscopy. (a) MFM image of the area shown in FIG. 5. The C variants appear as dark lines indicating strong interaction with the MFM tip and out-of-plane magnetization. The A and B variants are hardly distinguishable. Domains are elongated along the crystallographic c direction. (b) Magnified view of an area similar to (a) indicating an interaction of the domains across twin boundaries.

Figure 13A:
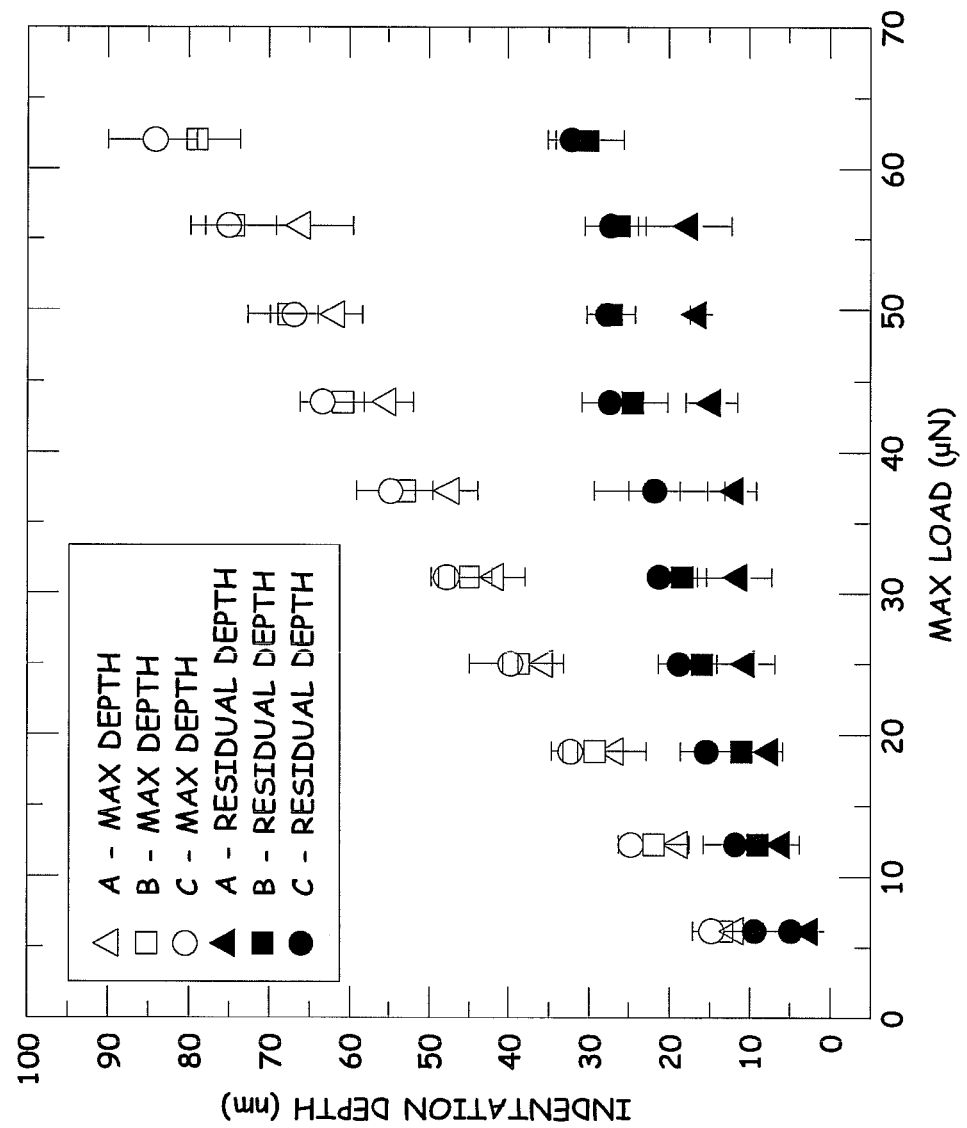
FIG. 13 (13a and 13b) show results from nanoindentation experiments of the Example below.
Figure 13B:
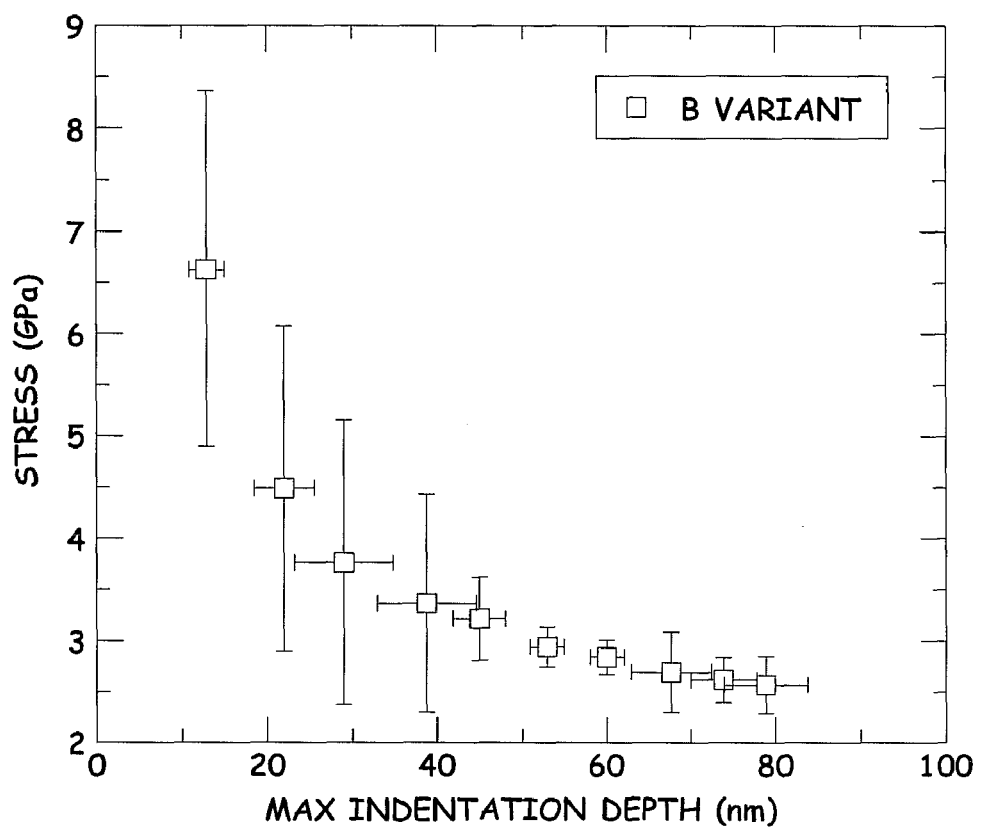

FIG. 13a displays the results of the nanoindentation experiments. Triangles, squares and circles refer to experiments in A, B, and C variants. Open symbols indicate the indentation depth at full load whereas frill symbols indicate the residual indentation depth after unloading. The indentation depth at full load increases almost linearly for all variants. The depth is deepest in the B variants and least deep in the A variants. The same trend is observed for the depth of the residual indent. However, the depth of the residual indent amounts to only about 30% of the depth at maximum load. The results of indentation experiments at different distances from the twin boundaries were identical within experimental error. FIG. 13b is the stress versus indentation depth diagram for the B domain. The stress represents a normalized value obtained from dividing the applied load by the area of the indent. The stress is initially very large and decreases with increasing depth.

FIGS. 13A and B: Results from nanoindentation experiments. (a) Indentation depth vs. maximum load. The open symbols represent the depth at maximum load; the full symbols mark the residual depth after unloading. Triangles, squares and circles indicate results from A, B, and C variants. The depth at maximum load increases nearly linearly with maximum applied load. The indentation depth in C variants is systematically larger than the depth in B and A variants. The residual deformation is smallest for A variants and about the same for B and C variants. (b) Data of B variants evaluated for stress vs. indentation depth. With increasing depth the average stress under the indenter decreases.

5. Discussion

For a cubic-to-orthorhombic martensite transformation, there are six orientation variants in the martensitic phase. Each variant has six {110}<1$\bar{1}$0> twinning systems; two of each ab-, bc-, and ac-twin type [references 4, 13]. Thus, there are 36 possible twinning systems not including twins forming within twill variants. It is remarkable that given one known crystallographic direction in the predominant martensite variant, which in the present case is c, the analysis of the surface profile yields the complete crystallography of all twin variants. Thus, crystallographic orientation and spatial configuration of the twin structure can be fully characterized by AFM alone without employing diffraction methods.

The identification of the A, B, and C variants and the orientation of the twin boundaries prove the presence of ab-twins and bc-twins. For ab-twins (bc-twins), the twin boundary contains the crystallographic c (a) direction. The stress induced by the AFM accidentally impacting the sample was sufficient to move the twin boundaries. Thus, ab-twins and bc-twins are very mobile. It was suggested in [reference 4] that different twinning modes are active in orthorhombic Ni—Mn—Ga MSMA resulting in a variation of the magnetic-field-induced strain. The present results substantiate that suggestion.

The magnetic-force microscopy images reveal a strong signal for the C variants. Since the magnetization of the MFM tip is perpendicular to the surface, a strong signal indicates an out-of-plane magnetization, which is parallel to the crystallographic c direction. The c direction is the direction of easy magnetization in orthorhombic Ni—Mn—Ga martensite [reference 3]. Thus, the conclusion that the C valiant has out-of-plane magnetization is consistent with the magnetic properties of the material. The magnetic contrast in A and B variants reveals magnetic domains which are elongated along the crystallographic c direction. The width of the magnetic domains is the same for A and B variants. This indicates that magnetic domains have a rod-like shape. The domains match across twin boundaries (FIG. 8b) to ensure magnetic compatibility by avoiding magnetic charges on the twin boundaries [reference 22]. Similar magnetic domain structures were reported for tetragonal Ni—Mn—Ga martensite [references 23-25].

The results of the indentation experiments show that after unloading only about 30 percent of the total deformation remains. Permanent (plastic) deformation may be due to twinning or dislocation activity. Twinning causes reorientation of the lattice. In the A and B variants, twinning would produce C variants. C variants can be identified by MFM imaging via their strong signal stemming from out-of-plane magnetization (FIG. 8a). For most of the indents, the MFM signal did not displayed variation compared with the surrounding area. This indicates that the residual deformation was carried by lattice dislocations. This is an interesting result since in uniaxial compression tests, twinning occurs in this material at only a few MPa stress [references 4, 5] whereas yielding by dislocation motion requires a much higher stress level [reference 26]. Furthermore, under uniform loading, Heusler alloys tend to fail by brittle fracture [reference 26].

In nanoindentation experiments, the applied average stress under the tip area is largest at the beginning of the indentation since the area is very small. At a 10 nm indentation depth, the average normal stress at the surface is about 10 GPa (FIG. 8b). This is an enormous stress level. Thus, the stress near the surface might be sufficient to grow a twin. However, the stress field extends into the material only by about three times the indentation depth and decays very rapidly beyond that [reference 27]. Therefore, if a twin forms, it can grow only to a length of about three times the indentation depth. At this short distance, the interaction of the twinning disconnections with the surface is still strong. Upon unloading, the image force causes detwinning (i.e. pseudo-elastic twinning). This assumption follows Garber's conclusion (see discussion in reference [18]) that pseudo-elastic twinning requires stress concentrations while homogeneous loading leads to permanent twinning. Following this line of thought, the stress distribution caused by the accidental impact by the AFM covered a large enough area to cause permanent (plastic) twinning. One might conclude that with increasing indenter tip size and tip radius, there should be a transition from pseudo-elastic twinning to plastic twinning. Tall et al. [reference 28] indeed reported indentation-induced permanent twinning in LaAlO$_3$ using a microindenter. This indicates a size-effect on the deformation mechanisms operating under localized loading, which might be investigate using tips with different tip radii [reference 29].

About 70 percent of the deformation is recovered. It is unlikely, however, that 70 percent of the deformation is purely elastic. The recovery of deformation may stem from pseudo-elastic twinning or from the recovery of dislocations due to the image force. Dislocations contribute at least partially to deformation. This follows from highly localized deformation in the pileups next to the indents, which by far exceeds the twinning shear. Thus, dislocation motion is required to form pileups. However, the intensive and irreversible mutual interaction of dislocations prevents full recovery of the deformation after unloading [reference 30]. Thus, the large recoverable deformation is an indication that pseudo-elastic twinning took place.

6. Conclusions

The crystallography and spatial configuration of twinning systems can be characterized by using AFM provided a limited knowledge about the orientation state of one martensite variant.

Different twinning modes are active in orthorhombic Ni—Mn—Ga martensite. The ab- and bc-twinning modes were identified.

Magnetic domains in orthorhombic Ni—Mn—Ga martensite have the shape of rods elongated along the crystallographic c direction.

C variants are magnetized perpendicular to the surface and cause a strong stray-field leading to strong interaction with an MFM tip.

After nanoindentation about 70 percent of the deformation recovers. The residual deformation is carried by dislocation activity.

It is likely that pseudo-elastic twinning takes place during nanoindentation.

The results indicate a size-effect on twinning deformation under localized loading.

REFERENCES

[1] K. Ullakko, J. K. Huang, C. Kantner. R. C. O'Handley, V. V. Kokorin, J. Appl. Phys. 69 (1996)1966.
[2] R. C. O'Handley, J. Appl. Phys. 83 (1998) 3263.
[3] Sozinov, K. Ullakko, IEEE Trans. Magn. 38 (2002) 2814.
[4] P. Müllner, V. A. Chernenko, G. Kostorz, J. Appl. Phys. 95 (2004) 1531.
[5] P. Müllner, V. A. Chernenko, G. Kostorz, Scripta Mater. 49 (2003) 129.
[6] L. Straka, O. Heczko, Scripta Mater. 54 (2006) 1549.
[7] G. Li, Y. Liu, B. K. A. Ngoi, Scripta Mater. 53 (2005) 829.
[8] E. Arzt, Acta Mater. 46 (1998) 5611.
[9] J. R. Greer, W. C. Oliver, W. D. Nix, Acta Mater. 53 (2005) 1821.
[10] R. C. Pond, P. J. Hirth, Solid State Physics, 47 (1994), 287-365.
[11] R. C. Pond, S. Celloto, Int. Mater. Rev. 48 (2003) 225.
[12] P. Müllner, V. A. Chernenko, M. Wollgarten, G. Kostorz, J. Appl. Phys. 92 (2002) 6708.
[13] P. Müllner, D. Mukherji, R. Erni, G. Kostorz, Proc. Int. Conf. "Solid to solid phase transformations in inorganic materials" PTM'05, Phoenix, Ariz., May 29-Jun. 3, 2006, Vol. 2, pp 171.
[14] P. Müllner, Int. J. f. Mater. Res. (formerly Z. f. Metallk.) 97 (2006) 205.
[15] G. Kostorz, P. Müllner, Z. f. Metallk. 96 (2005) 703.
[16] S. Rajasekhara, P. J. Ferreira, Scripta Mater. 53 (2005) 817.
[17] J. P. Hirth and J. Lothe, "Theory of dislocations", $2^{nd}$ Ed., Krieger, Malabar FL1992 pp. 86.
[18] A. M. Kosevich, Sov. Phys. Usp. 14 (1971) 286.
[19] P. Müllner, C. Solenthaler, Phil. Mag. Left. 69 (1994) 111-113.
[20] P. Müllner, C. Solenthaler, Phil. Mag. Lett 69 (1994) 171-175.
[21] S. V. Kamat, J. P. Hirth, P. Müllner, Phil. Mag. A 73 (1996) 669-680.
[22] N. I. Vlasova, G. S. Kandaurova, N. N. Shchegoleva, J. Magn. Magn. Mater. 222 (2000) 138.
[23] Y. Ge, O. Heczko, O. Söderberg, V. K. Lindroos, J. Appl. Phys. 96 (2004) 2159.
[24] M. R. Sullivan, H. D. Chopra, Phys. Rev. B 70 (2004) 094427.
[25] Q. Pan, R. D. James, J. Appl. Phys. 87 (2000) 4702.
[26] F. Xiong, Y. Liu, E. Pagounis, J. Magn. Magn. Mater. 285 (2005) 410.
[27] N. Schwarzer, G. M. Pharr, Thin Solid Films 469-470 (2004) 194.
[28] P. D. Tall, C. Coupeau, J. Rabier, Scripta Mater. 49 (2003) 903.
[29] Z. Xue, Y. Huang, K. C. Hwang, M. Li, J. Eng. Mater. Techn. 124 (2002) 371.
[30] C. R. Taylor, E. A. Stach, G. Salamo, A. P. Malshe, Appl. Phys. Lett. 87 (2005) 073108.

Some embodiments may be described as follows: The preferred system controls and detects the crystallographic state of a non-cubic crystal. Said crystallographic state may be connected/related to a magnetic state and/or to a shape state. Said crystallographic state may be controlled by a magnetic field and/or by a mechanical force field and/or an A/C electric field. The crystal may be a magnetic shape-memory alloy. The crystal may be magnetically and structurally anisotropic, and the magnetic and crystallographic anisotropy coupled. Said magnetic state may be controlled by a mechanical action. The magnetic state and/or the crystallographic state may be detected with the magneto-optical Kerr effect. The magnetic state and/or the crystallographic state may be detected with spin-polarized electrons. The magnetic state and/or the crystallographic state may be detected with optical interferometry, or with other or a combination of methods/effects. A system may be provided wherein two different states/functionalities selected from said magnetic states, crystallographic states, and shape states are simultaneously used as read and write operators. Two different states/functionalities may be selected from said magnetic state, crystallographic state, and shape state, said two different states/functionalities that are selected may be simultaneously used as sense and indicate operators. Two different states/functionalities selected from said magnetic state, crystallographic state, and shape state may be simultaneously used as sense and control operators. Said magnetic states and/or crystallographic states and/or shape states may be embodied in crystal attached to or grown on a substrate. Said magnetic state and/or crystallographic state and/or shape states may be embodied in individual bits/elements embedded in a crystal.

In some embodiments, a system for writing and reading data comprises control and detection of crystallographic states of a magnetic shape-memory alloy or other magnetoplastic and/or magnetoelastic material. Said crystallographic state may be connected/related to a magnetic state and/or to a shape state. Said crystallographic state may be controlled by a magnetic field and/or by a mechanical force field and/or an A/C electric field. The crystal may be magnetically and structurally anisotropic and the magnetic and crystallographic anisotropy are coupled. Said magnetic state may be controlled by a mechanical action. The magnetic state and/or the crystallographic state may be detected with the magneto-optical Kerr effect. The magnetic state and/or the crystallographic state may be detected with the spin-polarized electrons. The magnetic state and/or the crystallographic state may be detected with optical interferometry. The magnetic state and/or the crystallographic state may be detected with other methods than mentioned above. The magnetic state and/or the crystallographic state may be detected with a plurality/combination of effects selected from the group consisting of: magneto-optical Kerr effect, spin-polarized electrons, and interferometry. The magnetic state and/or the crystallographic state is detected with a plurality/combination of effects selected from the group consisting of: magneto-optical Kerr effect, spin-polarized electrons, interferometry, and other effects not including diffraction-based methods. The system may be further adapted for sense&indicate functionality, and/or further adapted for sense&control functionality. Embodiments of the invention may comprise methods of writing and reading data/information comprising use of any of the systems described herein; and/or methods of sensing and indicating data/information comprising use of any of the systems described herein. In preferred embodiments of the apparatus, systems, and methods, said crystal comprises at least six crystallographic states. Preferably, said crystal further comprises multiple magnetic states.

Although this invention has been described above with reference to particular means, materials, and embodiments, it is to be understood that the invention is not limited to these disclosed particulars, but extends instead to all equivalents within the broad scope of the following claims.

The invention claimed is:

1. A logic or memory device comprising a magnetoplastic and/or magnetoelastic material having at least six states.

2. A device as in claim 1 which is a combined logic and memory device.

3. A device as in claim 1 wherein the memory is nonvolatile.

4. A device as in claim 2 wherein the memory is nonvolatile.

5. A device as in claim 1 wherein said states are shape states.

6. A device as in claim 1 wherein said states are magnetic states.

7. A device as in claim 1, wherein said material is magnetic shape memory alloy.

8. A device as in claim 1, wherein said material is selected from the group consisting of: Heusler shape-memory alloy, non-Heusler ferromagnetic shape-memory alloy, antiferromagnetic shape-memory alloy, non-shape-memory magnetoplastic alloy, $Ni_2MnGa$, Dy, $\alpha$-Fe, Co—Ni, $\tau$-MnAl—C, $L1_0FePd$, $L1_0CoPt$, $L1_0FePt$, $Ni_2MnGa$, $Co_2NiGa$, $Ni_2MnAl$, $Ni_2FeGa$, $Fe_3Pd$, Fe—Pd—PT, $\gamma$-Mn—Fe—Cu, $Ni_{51}Mn_{28}Ga_{21}$, Ni—Mn—Ga alloys, Ni—Mn—Ga ferromagnetic martensite, and combinations thereof.

9. A method of writing data on an element having more than two states, wherein the element comprises a magnetoplastic and/or magnetoelastic material having at least six states.

10. A method as in claim 9, wherein the writing step comprises application of a magnetic field change.

11. A method as in claim 9, wherein the writing step comprises application of a mechanical force.

12. A method as in claim 9, wherein the states are shape states.

13. A method as in claim 9 wherein said states are magnetic states.

14. A method as in claim 9, wherein said material is a magnetic shape memory alloy.

15. A method of reading data from an element having more than two states, wherein the element comprises a magnetoplastic and/or magnetoelastic material having at least six states.

16. A method as in claim 15, wherein the writing step comprises application of a magnetic field change.

17. A method as in claim 15, wherein the writing step comprises application of a mechanical force.

18. A method as in claim 15, wherein the states are shape states.

19. A method as in claim 15 wherein said states are magnetic states.

20. A method as in claim 15, wherein said material is a magnetic shape memory alloy.

21. A method as in claim 15, wherein the reading step is conducted with atomic-force microscopy.

22. A method as in claim 15, wherein the reading step is conducted with magnetic-force microscopy.

23. A method as in claim 15, wherein the reading step is conducted with spin-polarized electrons.

24. A method as in claim 15, wherein the reading step is conducted with magneto-optical Kerr-effect.

25. A method as in claim 15, wherein the reading step is conducted with optical inferometry.

26. A method of writing data on, and reading data from, an element having more than two states, wherein the element comprises a magnetoplastic and/or magnetoelastic material having at least six crystallographic states.

27. A method of claim 26 wherein the writing step is selected from the group consisting of application of a magnetic field and application of mechanical force.

28. A method as in claim 26 wherein the reading step is selected from the group consisting of: atomic-force microscopy, magnetic-force microscopy, spin-polarized electrons, magneto-optical Kerr effect, and optical interferometry.

29. A method of combining memory and logic functionalities in a single element having more than two states, wherein the element comprises at least one magnetoplastic and/or magnetoelastic material having at least six states.

30. A method as in claim 29, which combines read and write capabilities.

31. A method as in claim 29, which combines sense and indicate capabilities.

32. A method as in claim 29, which combines read and control capabilities.

33. A method as in claim 29, wherein said at least six states are shape states.

34. A method as in claim 29, wherein said at least six states are magnetic states.

35. A device as in claim 1 that is a data reading and writing device.

36. A device as in claim 1 that is a displacement and sensing device.

37. A device as in claim 1 that is a sensing and control device.

38. A device as in claim 1 that is a sensing and indicating device.

* * * * *